(12) United States Patent
Wakui et al.

(10) Patent No.: US 10,121,778 B2
(45) Date of Patent: Nov. 6, 2018

(54) SEMICONDUCTOR DEVICE

(71) Applicant: Toshiba Memory Corporation, Minato-ku, Tokyo (JP)

(72) Inventors: Taichi Wakui, Kanagawa (JP); Yasuhiro Suematsu, Kanagawa (JP); Yuui Shimizu, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/455,695

(22) Filed: Mar. 10, 2017

(65) Prior Publication Data

US 2017/0345814 A1  Nov. 30, 2017

(30) Foreign Application Priority Data

May 24, 2016  (JP) ................. 2016-103546

(51) Int. Cl.
  *H01L 27/00* (2006.01)
  *H01L 27/02* (2006.01)
  (Continued)

(52) U.S. Cl.
  CPC ...... *H01L 27/0266* (2013.01); *H01L 23/5226* (2013.01); *H01L 23/5228* (2013.01);
  (Continued)

(58) Field of Classification Search
  None
  See application file for complete search history.

(56) References Cited

U.S. PATENT DOCUMENTS

| | | |
|---|---|---|
| 8,284,530 B1 | 10/2012 | Vashchenko et al. |
| 2008/0310061 A1 | 12/2008 | Jeon et al. |

FOREIGN PATENT DOCUMENTS

| | | |
|---|---|---|
| JP | 2002-110909 A | 4/2002 |
| JP | 2007-019413 A | 1/2007 |
| TW | 200610130 A | 3/2006 |

(Continued)

OTHER PUBLICATIONS

Taiwanese Office Action issued Jan. 16, 2018 in corresponding Taiwanese Patent Application No. 106104577, along with an English translation thereof.

*Primary Examiner* — Reema Patel
(74) *Attorney, Agent, or Firm* — White & Case LLP

(57) ABSTRACT

According to one embodiment, an electrostatic discharge semiconductor device includes one or more wiring layers first disposed over a substrate, including: a wiring electrically connected at a first connecting point of a pad, a second wiring electrically connected at a second connecting point of a ground wiring, and a third wiring electrically connected at a third connecting point of the ground wiring; a first transistor formed in the substrate comprising a first diffusion region electrically connected to the first wiring, a second diffusion region electrically connected to the second wiring, and a gate electrically connected to the ground wiring; and a second transistor formed in the substrate comprising the first diffusion region electrically connected to the first wiring, a third diffusion region electrically connected to the third wiring, and a gate electrically connected to the ground wiring, wherein, a first resistance value of a first current pathway leading from the first connecting point to the second connecting point via the first transistor is different from a second resistance value of a second current pathway leading from the first connecting point to the third connecting point via the second transistor.

20 Claims, 15 Drawing Sheets

(51) Int. Cl.
 *H01L 23/522* (2006.01)
 *H01L 29/08* (2006.01)
 *H01L 29/78* (2006.01)
(52) U.S. Cl.
 CPC ...... *H01L 27/0288* (2013.01); *H01L 29/0847* (2013.01); *H01L 29/7848* (2013.01)

(56) References Cited

FOREIGN PATENT DOCUMENTS

| TW | 200828556 A | 7/2008 |
|----|-------------|--------|
| TW | 200828557 A | 7/2008 | ary

SEMICONDUCTOR DEVICE

CROSS-REFERENCE TO RELATED APPLICATION

This application is based upon and claims the benefit of priority from Japanese Patent Application No. 2016-103546, filed May 24, 2016, the entire contents of which are incorporated herein by reference.

FIELD

Embodiments described herein relate generally to a semiconductor device.

BACKGROUND

A semiconductor device has an electrostatic discharge (ESD) protection circuit incorporated therein to protect an internal circuit against a high-voltage pulse (surges) generated by ESD.

DETAILED DESCRIPTION

Figure 1:
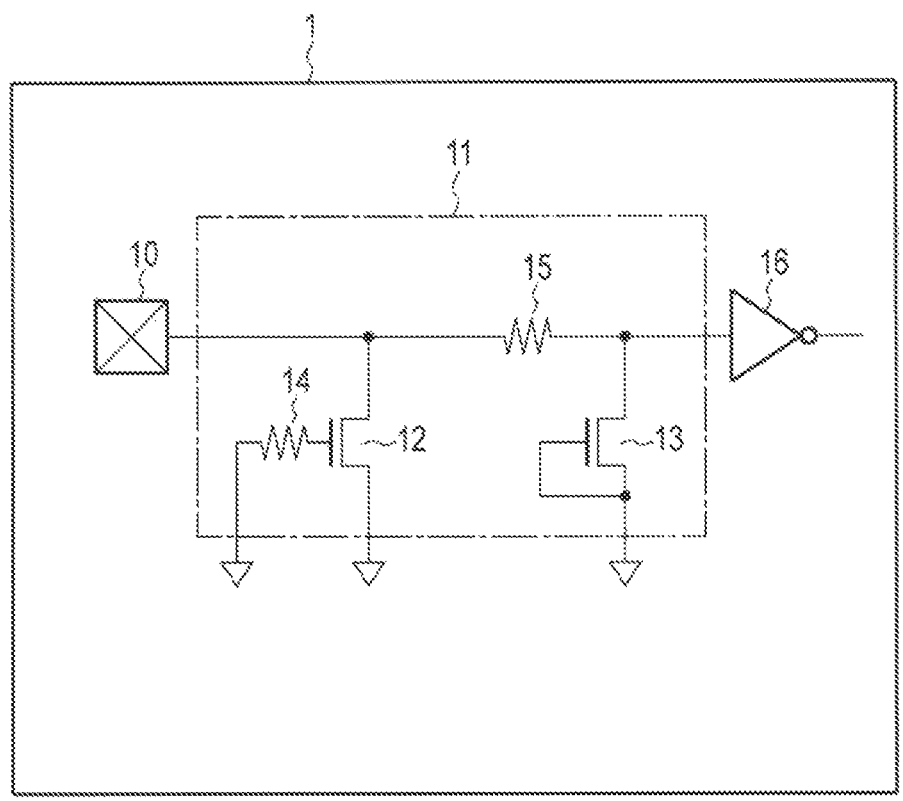
FIG. 1 is a circuit diagram of an ESD protection circuit included in a semiconductor device according to a first embodiment.

An exemplary embodiment provides a semiconductor device capable of improving an ESD breakdown voltage. In general, according to one embodiment, an electrostatic discharge semiconductor device includes one or more wiring layers disposed over a substrate, including a first wiring electrically connected at a first connecting point of a pad, a second wiring electrically connected at a second connecting point of a ground wiring, and a third wiring electrically connected at a third connecting point of the ground wiring; a first transistor formed in the substrate comprising a first diffusion region electrically connected to the first wiring, a second diffusion region electrically connected to the second wiring, and a gate electrically connected to the ground wiring; and a second transistor formed in the substrate comprising the first diffusion region electrically connected to the first wiring, a third diffusion region electrically connected to the third wiring, and a gate electrically connected to the ground wiring, wherein, a first resistance value of a first current pathway leading from the first connecting point to the second connecting point via the first transistor is different from a second resistance value of a second current pathway leading from the first connecting point to the third connecting point via the second transistor.

Hereinafter, exemplary embodiments will be described with reference to the drawings, in this description, similar portions are assigned the respective same reference characters over all the figures.

1. First Embodiment

A semiconductor device according to a first embodiment is described.

1.1 Configuration of ESD Protection Circuit Included in Semiconductor Device First, a configuration of an ESD protection circuit included in the semiconductor device is described. FIG. 1 is a circuit diagram of the ESD protection circuit included in the semiconductor device according to the present embodiment.

As illustrated in FIG. 1, the semiconductor device 1 includes an electrode pad 10, an ESD protection circuit 11, and an input buffer 16. Furthermore, while FIG. 1 illustrates, by way of example, one electrode pad 10 and an ESD protection circuit 11 and an input buffer 16 which are connected to the electrode pad 10, the other electrode pads 10 have also a similar configuration.

The electrode pad 10 is an input terminal which is electrically connectable to, for example, an external device. The semiconductor device 1 can import various input signals via the electrode pad 10. Furthermore, the number and location of electrode pads 10 are optional.

The input buffer 16 converts an input signal received from, for example, an external device into, for example, an appropriate voltage level or clock to be processed by an internal circuit (not illustrated) and then transfers a result of conversion to the internal circuit in the semiconductor device 1. The input buffer 16 has an input terminal connected to the electrode pad 10 via the ESD protection circuit 11 and an output terminal connected to the internal circuit (not illustrated) (for example, a control circuit)

The ESD protection circuit 11 prevents a high-voltage pulse (surges) generated by ESD from being applied to the internal circuit. More specifically, the ESD protection circuit 11 discharges (electrically discharges) surges to the outside of the semiconductor device 1 via a ground voltage wiring (hereinafter referred to as a "VSS wiring") and a ground voltage terminal (not illustrated) (hereinafter referred to as a "VSS pad"). The ESD protection circuit 11 includes N-channel MOS transistors (NMOS transistors) 12 and 13 and resistor elements 14 and 15. Hereinafter, the NMOS transistor 12 is referred to as a "first transistor 12", and the NMOS transistor 13 is referred to as a "second transistor 13"

The first transistor 12 discharges mainly surge generated by the human body model (HBM) (hereinafter referred to as "HBM surge") to the outside of the semiconductor device 1 to prevent HBM surge from being applied to the internal circuit. HBM is a model of ESD in a case where an electrostatically-charged object that generates ESD is a human who operates the semiconductor device 1 or an external device connected to the semiconductor device 1. One of the source and drain of the first transistor 12 is connected to the electrode pad 10, and the other of the source and drain thereof is connected to the VSS wiring (is grounded). The VSS wiring is connected to the VSS pad. The gate of the first transistor 12 is connected to the VSS wiring (is grounded) via the resistor element 14. The back gate of the first transistor 12 is connected to the VSS wiring (is grounded). Thus, the first transistor 12 is a gate-grounded NMOS (GGNMOS) transistor. Furthermore, the number of first transistors 12 is not limited to one, so that a plurality of first transistors 12 can be connected in parallel.

The second transistor 13 discharges mainly surge generated by the charged-device model (CDM) (hereinafter referred to as "CDM surge") to the outside of the semiconductor device 1 to prevent CDM surge from being applied to the internal circuit. CDM is a model of ESD in a case where the semiconductor device 1 is electrostatically charged directly or indirectly and discharges an electrical current to an external device. A combination of the resistor element 15 and the second transistor 13 constitutes an ESD protection circuit against CDM surge.

One of the source and drain of the second transistor 13 is connected to the electrode pad 10 via the resist or element 15. The other of the source and drain, gate, and back gate of the second transistor 13 are connected to the VSS wiring (are grounded). Thus, the second transistor 13 is a gate-grounded NMOS (GGNMOS) transistor as with the first transistor 12. Furthermore, the number of second transistors 13 is not limited to one, so that a plurality of second transistors 13 can be connected in parallel. Moreover, the second transistor 13 can be omitted.

1.2 Layout of First Transistor

Next, a layout of the first transistors 12 is described with reference to FIGS. 2 and 3. While, in the following description, a case is described in which the drain of the first transistor 12 is connected to the electrode pad 10 and the source thereof is connected to the VSS wiring 20, the source and drain of the first transistor 12 can be replaced with each other.

Figure 2:
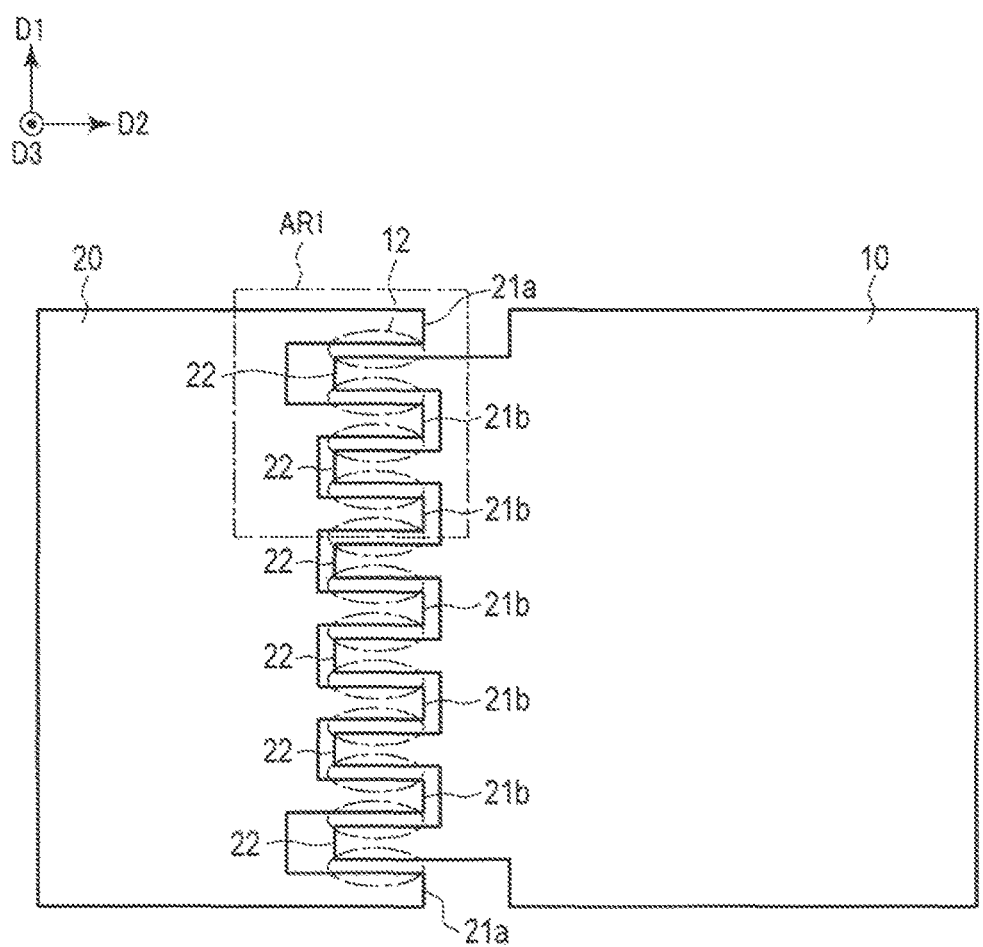
FIG. 2 is a layout chart of an electrode pad and a VSS wiring included in the semiconductor device according to the first embodiment.

FIG. 2 is a layout chart of the electrode pad 10 and the VSS wiring 20 included in the semiconductor device according to the present embodiment. FIG. 3 is a layout chart obtained by enlarging a region AR1 illustrated in FIG. 2.

As illustrated in FIG. 2, the electrode pad 10 and the VSS wiring 20 are located in such a manner that respective sides thereof extending along a first direction D1 parallel to the semiconductor substrate are adjacent to each other. The electrode pad 10 has six drain wirings 22 connected to the side thereof adjacent to the VSS wiring 20. The drain wiring 22 connects the electrode pad 10 and the drain of the first transistor 12. The six drain wirings 22 are arranged side by side along the first direction D1, and each drain wiring 22 is parallel with the semiconductor substrate and extends in a second direction D2 that is perpendicular to the first direction D1. The six drain wirings 2 are arranged approximately at regular intervals along the first direction D1, The six drain wirings 22 are almost the same in wiring length.

The VSS wiring 20 has seven source wirings 21 (21a and 21b) connected to one side thereof adjacent to the electrode pad 10. The source wirings 21 (21a and 21b) connect the VSS wiring 20 and the sources of the first transistors 12. The seven source wirings 21 (21a and 21b) are arranged side by side in the first direction D1, and each of the source wirings 21 (21a and 21b) extends in the second direction D2. The source wirings 21 (21a and 21b) and the drain wirings 22 are alternately arranged one by one along the first direction D1. More specifically, one drain wiring 22 is located between two source wirings 21 (21a and 21b). Therefore, the number of source wirings 21 (21a and 21b) is greater by one than the number of drain wirings 22. Furthermore, the respective numbers of source wirings 21 (21a and 21b) and drain wirings 22 are optional. However, the number of source wirings 21 (21a and 21b) is greater by one than the number of drain wirings 22.

In the following description, in the case of differentiating between source wirings located at both ends in the first direction D1 and the other source wirings, the source wirings located at both ends are referred to as the "source wirings 21a" and the other source wirings are referred to as the "source wirings 21b". In the present embodiment, the seven source wirings 21 (21a and 21b) are arranged approximately at regular intervals along the first direction D1, and are also arranged in such a manner that the respective wiring intervals with the drain wirings 22 are approximately regular intervals. Moreover, the wiring length of the source wiring 21a is greater than the wiring length of the source wiring 21b.

In the example illustrated in FIG. 2, twelve first transistors 12 are respectively provided in regions in which the source wirings 21 (21a and 21b) and the drain wirings 22 are alternately arranged one by one along the first direction D1. More specifically, the gate (not illustrated) of the first transistor 12 is provided between the source wiring 21 (21a or 21b) and the drain wiring 22 in the first direction D1. Then, the drain of the first transistor 12 is connected to the drain wiring 22, and the source thereof is connected to the source wiring 21 (21a or 21b).

Hereinafter, a region that contains the source wiring 21a and two source wirings 21b and two drain wirings 22 located between those source wirings along the first direction D1 is referred to as a "region AR1".

Next, details of a layout of the source wirings 21 (21a and 21b), the drain wirings 22, and the first transistors 12 are described with reference to FIG. 3.

Figure 3:
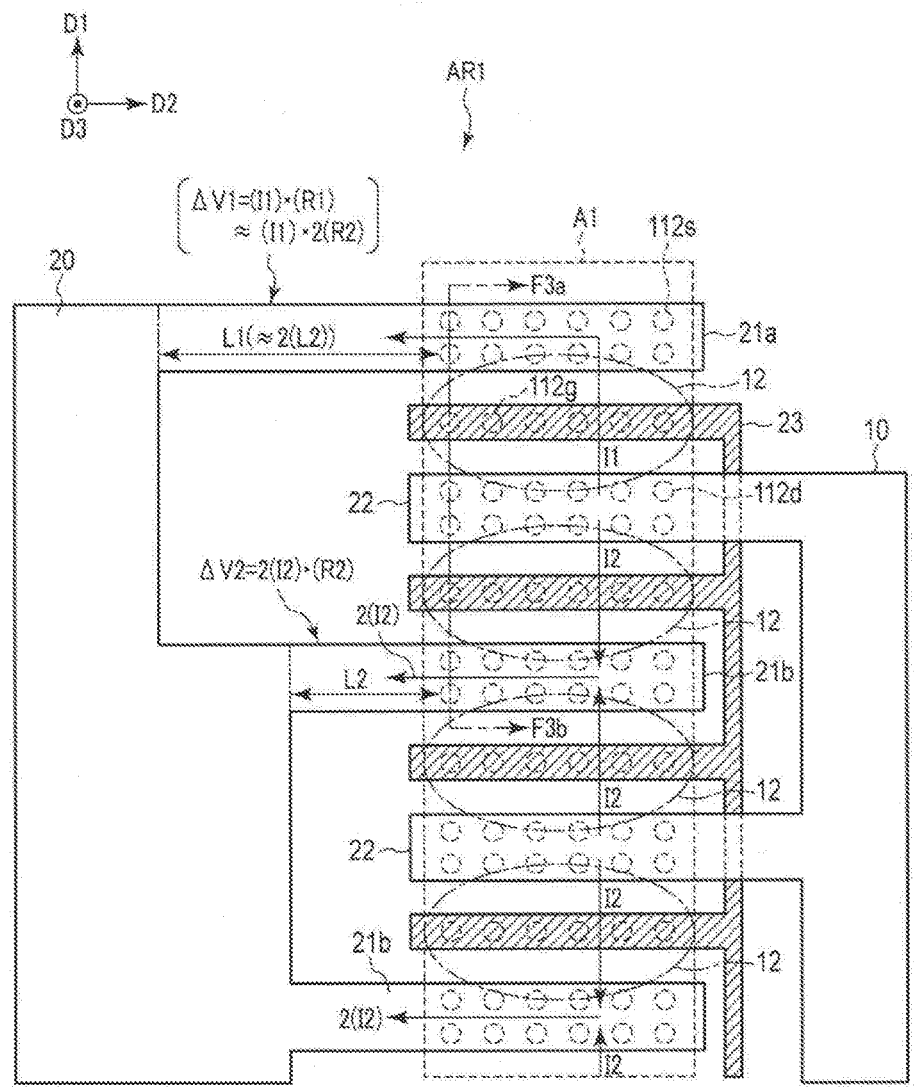
FIG. 3 is a layout chart of a region AR1 illustrated in FIG. 2.

As illustrated in FIG. 3, a gate wiring 23 which extends in the second direction D2 is provided between the source wiring 21 (21a or 21b) and the drain wiring 22. The gate wiring 23 connects the gate of the first transistor 12 and the VSS wiring 20 via the resistor element 14. In a region in which a plurality of source wirings 21 (21a and 21b) and a plurality of drain wirings 22 are arranged along the first direction D1, a plurality of first transistors 12 is provided on the semiconductor substrate along the first direction D1. Hereinafter, a region which is surrounded by an element isolation area in the vicinity of the surface of the semiconductor substrate and in which a plurality of first transistors is provided is referred to as an "activation region A1". The source of the first transistor 12 is connected to the source wiring 21 (21a or 21b) via contact plugs 112s, which extends in the third direction D3 perpendicular to the semiconductor substrate. Similarly, the drain of the first transistor 12 is connected to the drain wiring 22 via contact plugs 112d, which extends in the third direction D3, and the gate of the first transistor 12 is connected to the gate wiring 23 via contact plugs 112g, which extends in the third direction D3. Hereinafter, in a case where no specific distinction is required, each of the contact plugs 112s, 112d, and 112g is referred to as a "contact plug 112".

More specifically, each first transistor 12 is located in such a way as to share the source region and the drain region with an adjoining first transistor 12. Therefore, the drains of two adjoining first transistors 12 are connected to one drain wiring 22. Similarly, the sources of two adjoining first transistors 12 are connected to one source wiring 21b. In contrast to this, since the source wiring 21a is located at the end portion as viewed in the first direction D1, the source of one first transistor 12 is connected to the source wiring 21a. Moreover, the gates of twelve first transistors 12 are connected to the gate wiring 23 in common.

In the present embodiment, the number of contact plugs 112s connected to the source wiring 21a is the same as the number of contact plugs 112s connected to the source wiring 21b. Thus, the combined resistance value of a plurality of contact plugs 112s connected to the source wiring 21a is almost the same as the combined resistance value of a plurality of contact plugs 112s connected to the source wiring 21b. In the example illustrated in FIG. 3, the source wiring 21a is connected to the source of one first transistor 12 via twelve contact plugs 112s, which are arrayed in two columns along the second direction D2. The source wiring 21b is connected to the source shared by two first transistors 12 via twelve contact plugs 112s, which are arrayed in two columns along the second direction 132.

The drain wiring 22 is connected to the source shared by two first transistors 12 via twelve contact plugs 112d, which are arrayed in two columns along the second direction D2. Moreover, the gate wiring 23 is connected to the gate of one first transistor 12 via six contact plugs 112g, which are arrayed in one column along the second direction D2. Furthermore, the respective numbers of contact plugs 112s, contact plugs 112d, and contact plugs 112g respectively connected to the source wiring 21 (21a or 21b), the drain wiring 22, and the gate wiring 23 are optional. For example, the number of contact plugs 112s connected to the source wiring 21 (21a or 21b) can be different from the number of contact plugs 112d connected to the drain wiring 22. Moreover, for example, the respective numbers of contact plugs 112s, contact plugs 112d, and contact plugs 112g respectively connected to the source wiring 21 (21a or 21b), the drain wiring 22, and the gate wiring 23 can be the same.

Furthermore, the source wiring 21a in the present embodiment is longer than the source wiring 21b. More specifically, in the source wiring 21a, the wiring length from a connecting location between the source wiring 21a and the VSS wiring 20 (the end portion of the source wiring 21a) to a connecting location between the source wiring 21a and the source of the first transistor 12 (the contact plug 112s) is denoted by L1. Similarly, the wiring length in the source wiring 21b is denoted by L2. Then, the wiring lengths L1 and L2 are in a relationship of L1≈2(L2). In other words, the wiring length L2 of the source wiring 21a is approximately twice the wiring length L2 of the source wiring 21b.

1.3 Cross-section Structure of First Transistor

Next, a cross-section structure of the first transistor 12 is described.

Figure 4:
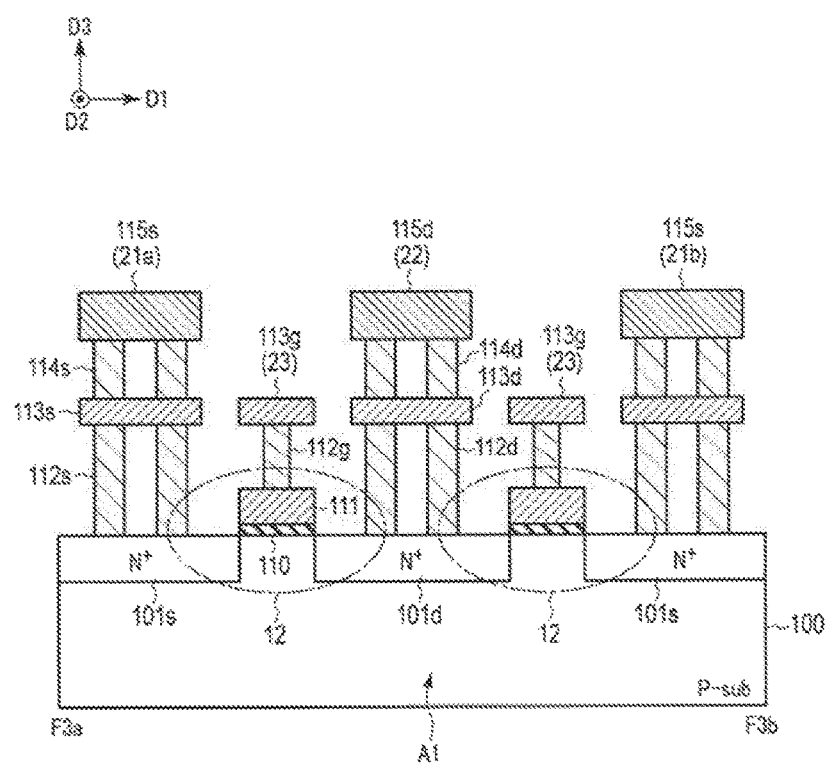
FIG. 4 is a sectional view taken along line F3a-F3b illustrated in FIG. 3.

FIG. 4 is a sectional view taken along line F3a-F3b in FIG. 3. Furthermore, in the illustration of FIG. 4, an interlayer insulating film is omitted.

As illustrated in FIG. 4, a plurality of N$^+$ diffusion layers 101 (101d and 101s) extending in the second direction D2 is provided along the first direction D1 on the surface region of a P-type semiconductor substrate 100. The N$^+$ diffusion layers 101 (101d and 101s) each function as the source or drain of the first transistor 12. In the following description, in the case of differentiating between the N$^+$ diffusion layers 101 (101d and 101s), the N$^+$ diffusion layer functioning as the source of the first transistor 12 is referred to as the "N$^+$ diffusion layer 101s", and the N$^+$ diffusion layer functioning as the drain of the first transistor 12 is referred to as the "N$^+$ diffusion layer 101d". Furthermore, in a case where a P-type well is provided on the surface region of the P-type semiconductor substrate 100, the N$^+$ diffusion layers 101 (101d and 101s) can be provided in the P-type well. Alternatively, an N-type well can be provided on the surface region of the P-type semiconductor substrate 100 and a P-type well can be provided on the surface region of the N-type well.

A plurality of gate insulating films 110 extending in the second direction D2 is provided along the first direction D1 on the semiconductor substrate 100, and gate electrodes 111 are provided on the upper surfaces of the gate insulating films 110. The gate insulating film 110 and the gate electrode 111, which is located on the gate insulating film 110, function as the gate of the first transistor 12. Then, the N$^+$ diffusion layer 101s is electrically connected to a wiring layer 113s via the contact plug 112s. Similarly, the N$^+$ diffusion layer 101d is electrically connected to a wiring layer 113d via the contact plug 112d. Moreover, the gate electrode 111 is electrically connected to a wiring layer 113g via the contact plug 112g. The wiring layer 113g connected to the gate electrode 111 functions as, for example, the gate wiring 23. Hereinafter, in a case where no specific distinction is required, each of the wiring layers 113s, 113d, and 113g is referred to as a "wiring layer 113". The contact plug 112 is formed with the use of a conductive material, such as tungsten (W), copper (Cu), aluminum (Al), or a semiconductor. The wiring layer 113 is formed with the use of, for example, W, Cu, or Al.

The wiring layer 113s is electrically connected to a wiring layer 115s via contact plugs 114s. Similarly, the wiring layer 113d is electrically connected to a wiring layer 115d via contact plugs 114d. The wiring layer 115s functions as, for example, the source wiring 21a or 21b, and the wiring layer 115d functions as, for example, the drain wiring 22. Hereinafter, in a case where no specific distinction is required, each of the contact plugs 114s and 114d is referred to as a "contact plug 114", and, in a case where no specific distinction is required, each of the wiring layers 115s and 115d is referred to as a "wiring layer 115". The contact plug 114 and the wiring layer 115 are formed with the use of, for example, W, Cu, or Al. In the present embodiment, the wiring width and wiring height of the wiring layer 115s functioning as the source wiring 21a are almost the same as the wiring width and wiring height of the wiring layer 115s functioning as the source wiring 21b.

In the present embodiment, the resistance value of a portion leading from the source of each first transistor 12 to the corresponding source wiring 21 (21a or 21b) is almost uniform. More specifically, as with the contact plug 112s, the number of contact plugs 114s connected to the source wiring 21a and the number of contact plugs 114s connected to the source wiring 21b are the same. Thus, the combined resistance value of a plurality of contact plugs 114s connected to the source wiring 21a is almost the same as the combined resistance value of a plurality of contact plugs 114s connected to the source wiring 21b. Therefore, the resistance value in a current pathway leading from a connecting location between the source of the first transistor 12 and the contact plug 112s to a connecting location between the source wiring 21a and the contact plug 114s is almost the same as the resistance value in a current pathway leading from a connecting location between the source of the first transistor 12 and the contact plug 112s to a connecting location between the source wiring 21b and the contact plug 114s.

Furthermore, in the present embodiment, the on-resistance of each first transistor 12 is almost uniform. More specifically, the on-resistance of the first transistor 12 connected to the source wiring 21a is almost the same as the on-resistance of the first transistor 12 connected to the source wiring 21b. In other words, the gate size (gate width and gate length) of each first transistor 12 is almost uniform. Moreover, the distance from the gate end in the $N^+$ diffusion layer 101s of each first transistor 12 to the contact plug 112s is almost uniform. Similarly, the distance from the gate end in the $N^+$ diffusion layer 101d of each first transistor 12 to the contact plug 112d is almost uniform.

Furthermore, the number of contact plugs 112 (112d and 112s) connected to one $N^+$ diffusion layer 101 (101d or 101s) can be the same as or can be different from the number of contact plugs 114 (114d and 114s). Moreover, the contact size (the diameter of the plug) of the contact plug 112 (112d or 112s) can be the same as or can be different from that of the contact plug 114 (114d or 114s).

Additionally, while, in the example illustrated in FIG. 4, a case has been described in which the source wirings 21 (21a and 21b) and the drain wiring 22 and the gate wiring 23 are formed in the respective different wiring layers, those wirings can be formed in the same wiring layers. Moreover, the source wirings 21 (21a and 21b) and the drain wiring 22 can be formed in the respective different wiring layers.

In addition, while, in the example illustrated in FIG. 4, a case has been described in which the wiring layer 115 (115d or 115s) functions as the source wiring 21 (21a or 21b) and the drain wiring 22, a wiring layer functioning as the source wiring 21 (21a or 21b) and the drain wiring 22 is not limited to a specific one. For example, the source wiring 21 (21a or 21b) and the drain wiring 22 can be provided in the wiring layer 113. Moreover, for example, in a case where a wiring layer is provided above the wiring layer 115, the source wiring 21 (21a or 21b) and the drain wiring 22 can be provided in that wiring layer. In other words, the number of wiring layers lying between the source wiring 21 (21a or 21b) and the drain wiring 22 and the $N^+$ diffusion layer 101 (101d or 101s) is not limited to a specific number.

1.4 Current Pathway of Discharge Current Caused by HBM Surge

Next, referring back to FIG. 3, a current pathway of discharge current caused by HBM surge is described.

As illustrated in FIG. 3, a discharge current which flows from the drain wiring 22 to the source wiring 21a via the first transistor 12 is denoted by I1 and a discharge current which flows through the source wiring 21b is denoted by I2. Then, since one first transistor 12 is connected to the source wiring 21a, the current I1 flows from the source wiring 21a to the VSS wiring 20. In contrast to this, since two first transistors 12 are connected to the source wiring 21b, a current which is approximately twice the current I2 flows from the source wiring 21b to the VSS wiring 20.

In the source wirings 21a and 21b, the respective wiring resistance values in the wiring lengths L1 and L2 are denoted by R1 and R2, respectively. Then, since a relationship of L1≈2(L2) holds, the wiring resistance values R1 and R2 have a relationship of R1≈2(R2).

Furthermore, in the source wirings 21a and 21b, increases in potential caused by the flow of discharge current, which are denoted by ΔV1 and ΔV2, can be expressed as follows.

$$\Delta V1=(I1)\cdot(R1)\approx(I1)\cdot 2(R2)$$

$$\Delta V2=2(I2)\cdot(R2)$$

Here, since the source wirings 21a and 21b are connected to the VSS wiring 20 in common, ΔV1=ΔV2 holds. Accordingly, I1≈I2 holds. In other words, discharge current with approximately the same current value flows through each first transistor 12. At this time, in the source wiring 21b, a current which is approximately twice the current flowing in the source wiring 21a flows.

1.5 Advantageous Effects of Present Embodiment

The configuration according to the present embodiment is able to provide a semiconductor device capable of improving resistance to ESD. Advantageous effects of the present embodiment are described as follows.

In a case where a GGNMOS transistor is used as an SD protection element, in order to protect the GGNMOS transistor from being broken by surges (discharge current), in many cases, a plurality of GGNMOS transistors is connected in parallel so as to reduce a load (current) applied to each GGNMOS transistor. In such a case, the GGNMOS transistors are required to be laid out in such a manner that discharge current homogenously flows through all of the GGNMOS transistor thus preventing charge (current) from concentrating on one GGNMOS transistor.

Therefore, in the configuration according to the present embodiment, a plurality of first transistors 12 (GGNMOS transistors) is provided between the electrode pad 10 and the VSS wiring 20 along a direction along which the electrode pad 10 and the VSS wiring 20 face each other (the first direction D1). Each first transistor 12 is located in such a way as to share the source or drain with an adjoining first transistor 12. The source wirings 21 (21a and 21b), which connect the VSS wiring 20 and the sources of the first transistors 12, and the drain wirings 22, which connect the electrode pad 10 and the drains of the first transistors 12, are alternately arranged one by one along the first direction D1 in such a manner that one drain wiring 22 is located between two source wirings 21 (21a and 21b). Then, the source of one first transistor 12 is connected to each of the source wirings 21a located at both ends in the first direction D1, and the sources of two first transistors 12 are connected to each of the other source wirings 21b.

In this case, the location of the first transistor 12 and a plurality of contact plugs 112s and 114s which are connected to the source wiring 21a is laid out in such a way as to approximately coincide with the location of the first transistor 12 and a plurality of contact plugs 112s and 114s which are connected to the source wiring 21b. Moreover, the wiring length L1 of the source wiring 21a, more specifically, the wiring length L1 from the connecting location between the source wiring 21a and the VSS wiring 20 to the connecting location between the source wiring 21a and the source of the first transistor 12 in the source wiring 21a, is laid out in such a way as to be approximately twice the wiring length L2 in the source wiring 21b.

With this, in a case where discharge current caused by HBM surge flows from the electrode pad 10 to the VSS wiring 20, the resistance value of the current pathway leading from the drain wiring 22 to the VSS wiring 20 via the first transistor 12 and the source wiring 21a is higher than the resistance value of the current pathway leading from the drain wiring 22 to the VSS wiring 20 via the first transistor 12 and the source wiring 21b. More specifically, the resistance value of the current pathway leading from the drain wiring 22 to the source wiring 21a via the first transistor 12 is approximately the same as the resistance value of the current pathway leading from the drain wiring 22 to the source wiring 21b via the first transistor 12. Then, the wiring resistance value R1 in the wiring length L1 of the source wiring 21a is a resistance value that is approximately twice the wiring resistance value R2 in the wiring length L2 of the source wiring 21b.

As a result, the current value of discharge current flowing through the source wiring 21a is approximately half the current value of discharge current flowing through the source wiring 21b in such a manner that an increase in potential caused by discharge current in the source wiring 21a and an increase in potential caused by discharge current in the source wiring 21b are almost the same. In other words, the discharge current I1 flowing through one first transistor 12 connected to the source wiring 21a and the discharge current I2 flowing through two first transistors 12 connected to the source wiring 21b are almost the same current value. Therefore, the current value of current flowing through every first transistor 12 is almost uniform, so that each first transistor 12 can be prevented from being broken by electric charge (current) concentrating on one first transistor 12. Accordingly, the resistance to ESD of the semiconductor device can be improved.

Moreover, the improvement of the resistance to ESD enables decreasing the number of first transistors 12 connected in parallel This also enables reducing the chip area.

Furthermore, while, in the present embodiment, a case has been described in which the wiring lengths L1 and L2 are different from each other, this is not limiting. The wiring resistance value R1 only needs to be almost twice the wiring resistance value R2. For example, the wiring lengths L1 and L2 can be set to approximately the same length, and the wiring width (or the wiring height) of the source wiring 21b can be set to almost twice the wiring width (or the wiring height) of the source wiring 21a.

2. Second Embodiment

Next, a semiconductor device according to a second embodiment is described. In the case of the second embodiment, in the N$^+$ diffusion region 101s of the first transistor 12, a distance from the gate of the first transistor 12 to the contact plug 112s connected to the source wiring 21a and a distance from the gate of the first transistor 12 to the contact plug 112s connected to the source wiring 21b are different from each other. In other words, a case in which there is a difference in resistance value between the sources of the first transistors 12 is described. In the following description, only things different from those of the first embodiment are described.

2.1 Layout of First Transistor

Figure 5:
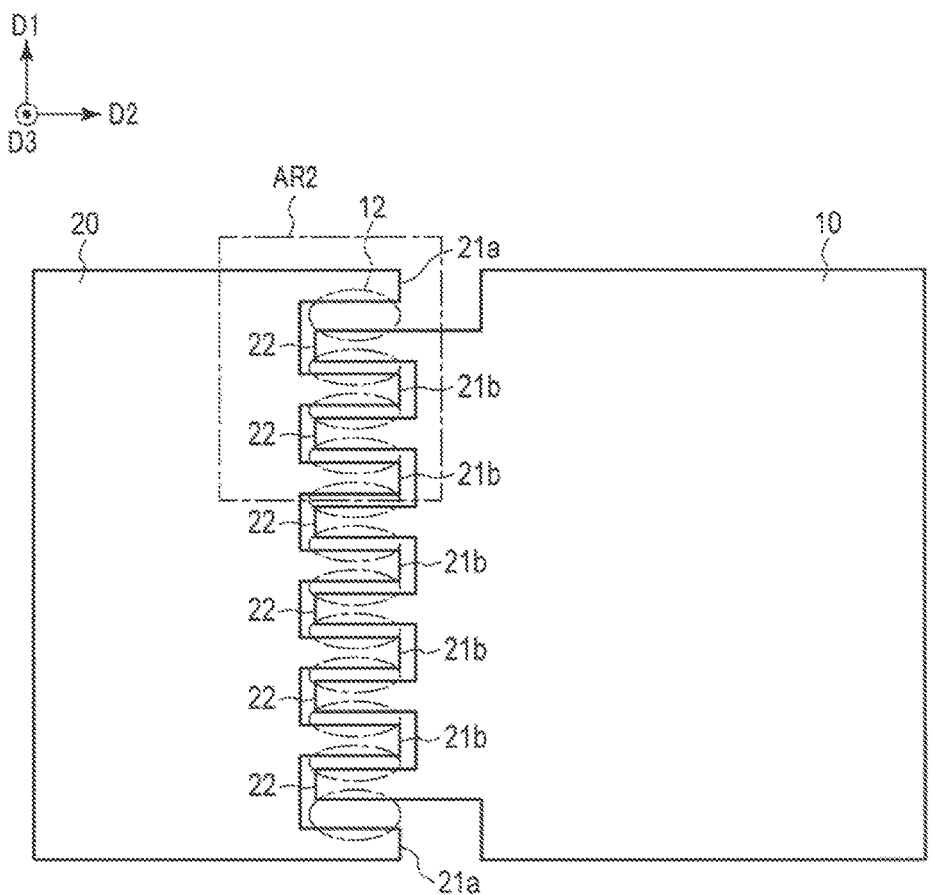
FIG. 5 is a layout chart of an electrode pad and a VSS wiring included in a semiconductor device according to a second embodiment.

First, a layout of the first transistors 12 is described with reference to FIGS. 5 and 6. FIG. 5 is a layout chart of the electrode pad 10 and the VSS wiring 20 included in the semiconductor device according to the present embodiment FIG. 6 is a layout chart obtained by enlarging a region AR2 illustrated in FIG. 5.

As illustrated in FIG. 5, in the present embodiment, the wiring lengths of the source wiring 21a and the source wiring 21b are approximately the same length. Moreover, the wiring interval between the source wiring 21a and the drain wiring 22 in the first direction D1 is wider than the wiring interval between the source wiring 21b and the drain wiring 22. Hereinafter, in FIG. 5, a region that contains the source wiring 21a and two source wirings 21b and two drain wirings 22 located between those source wirings along the first direction D1 is referred to as a "region AR2".

Next, details of a layout of the region AR2 are described with reference to FIG. 6.

Figure 6:
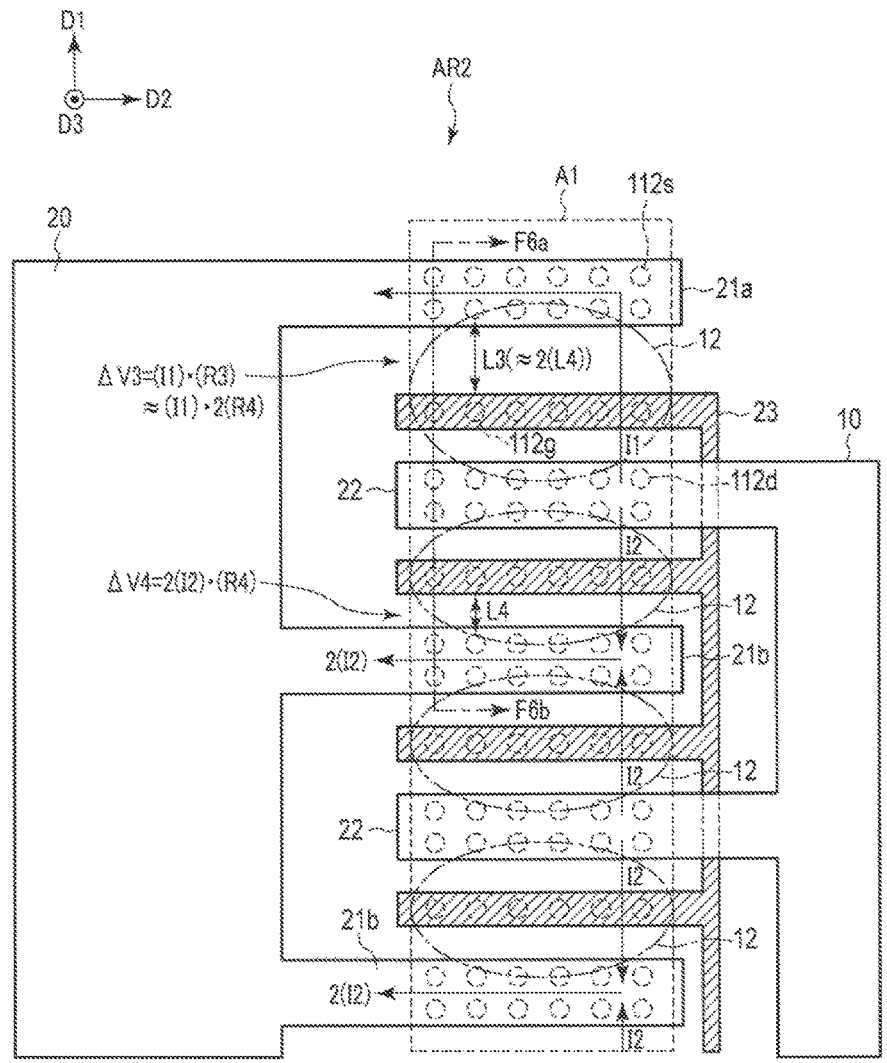
FIG. 6 is a layout chart of a region AR2 illustrated in FIG. 5.

As illustrated in FIG. 6, the distance between the source wiring 21a and the gate wiring 23 is greater than the distance between the source wiring 21b and the gate wiring 23. More specifically, in the N$^+$ diffusion layer 101s of the first transistor 12, the distance from the gate end of the first transistor 12 to the contact plug 112s connected to the source wiring 21a (hereinafter referred to as a "diffusion layer distance") is denoted by L3, and the diffusion layer distance to the contact plug 112s connected to the source wiring 21b is denoted by L4, Then, the diffusion layer distances L3 and L4 are laid out in such a way as to have a relationship of L3 ≈2(L4). Thus, the diffusion layer distance L3 of the source connected to the source wiring 21a is almost twice the diffusion layer distance L4 of the source connected to the source wiring 21b.

Moreover, the distance from the gate terminal in the N$^+$ diffusion layer 101d of each first. transistor 12 to the contact plug 112d is almost uniform.

2.2 Cross-section Structure of First Transistor

Next, a cross-section structure of the first transistor 12 is described.

Figure 7:
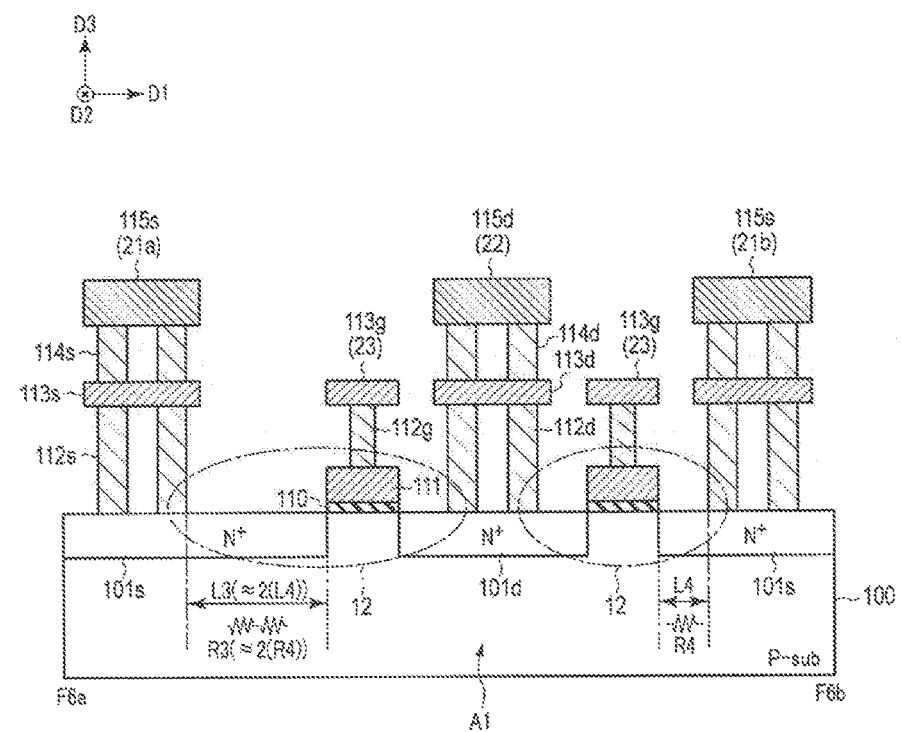
FIG. 7 is a sectional view taken along line F6a-F6b illustrated in FIG. 6.

FIG. 7 is a sectional view taken along line F6a-F6b in FIG. 6. Furthermore, in the illustration of FIG. 7, an interlayer insulating film is omitted.

As illustrated in FIG. 7, the diffusion layer resistance value (hereinafter referred to as a "source resistance value") of the diffusion layer distance L3 in the N$^+$ diffusion layer 101s is denoted by R3, and the source resistance value of the diffusion layer distance L4 is denoted by PA. Then, since the diffusion layer distances L3 and L4 have a relationship of L3 ≈2(I4), the source resistance values R3 and R4 have a relationship of R3≈2(R4). Thus, the source resistance value R3 is almost twice the source resistance value R4.

Furthermore, in the case of the present embodiment, as in the first embodiment, the numbers of contact plugs 112s or contact plugs 114s connected to the source wirings 21a and 21b are equal to each other.

2.3 Current Pathway of Discharge Current Caused by HBM Surge

Next, referring back to FIG. 6, a current pathway of discharge current caused by HBM surge is described.

As illustrated in FIG. 6, when an increase in potential in the source of the first transistor 12 connected to the source wiring 21a is denoted by ΔV3 and an increase in potential in the source of the first transistor 12 connected to the source wiring 21b is denoted by ΔV4, these increases in potential can be expressed as follows.

ΔV3=(I1)·(R3)≈(I1)·2(R4)

ΔV4=2(I2)·(R4)

In the present embodiment, the resistance value of a current pathway leading from the source of the first transistor 12 to the VSS wiring 20 via the source wiring 21a and the resistance value of a current pathway leading from the source of the first transistor 12 to the VSS wiring 20 via the source wiring 21b are approximately the same. In other words, the respective wiring resistance values of the source wiring 21a and the source wiring 21b are approximately the same, and the combined resistance value of a plurality of contact plugs 112s connected to the source wiring 21a and the combined resistance value of a plurality of contact plugs 114s connected to the source wiring 21a are almost the same as the combined resistance value of a plurality of contact plugs 112s connected to the source wiring 21b and the combined resistance value of a plurality of contact plugs 114s connected to the source wiring 21b. In such a case, ΔV3=ΔV4 holds. Accordingly, I1≈I2 holds. Thus, in every first transistor 12, discharge current with almost the same current value flows.

2.4 Advantageous Effects of Present Embodiment

The configuration according to the present embodiment is able to obtain advantageous effects similar to those of the first embodiment.

Furthermore, while, in the present embodiment, a case has been described in which the source resistance value R3 is almost twice the source resistance value R4, this is not limiting. The on-resistance of the first transistor 12 connected to the source wiring 21a only needs to be almost twice the on-resistance of the first transistor 12 connected to the source wiring 21b. For example, the distance from the gate end of the first transistor 12 to the drain wiring 22 in the N⁺ diffusion layer 101d can differ between the first transistor 12 connected to the source wiring 21a and the first transistor 12 connected to the source wiring 21b. In other words, the resistance value of the drain of the first transistor 12 connected to the source wiring 21a and the resistance value of the drain of the first transistor 12 connected to the source wiring 21b can be different from each other.

3. Third Embodiment

Next, a semiconductor device according to a third embodiment is described. In the case of the third embodiment, the number of contact plugs 112s connected to the source wiring 21a and the number of contact plugs 112s connected to the source wiring 21b are different from each other. In other words, a case in which the combined resistance value of a plurality of contact plugs 112s connected to the source wiring 21a is different from the combined resistance value of a plurality of contact plugs 112s connected to the source wiring 21b is described. In the following description, only things different from those of the first and second embodiments are described.

3.1 Layout of First Transistor

First, a layout of the first transistors 12 is described with reference to FIGS. 8 and 9.

Figure 8:
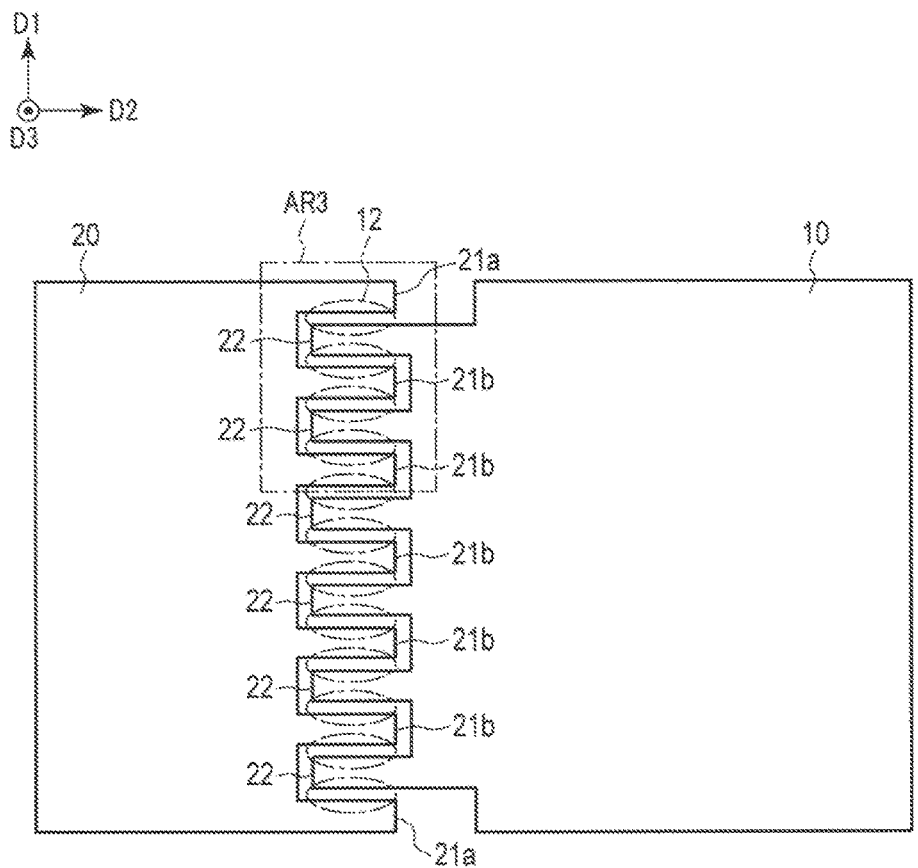
FIG. 8 is a layout chart of an electrode pad and a VSS wiring included in a semiconductor device according to a third embodiment.

FIG. 8 is a layout chart of the electrode pad 10 and the VSS wiring 20 included in the semiconductor device according to the present embodiment. FIG. 9 is a layout chart obtained by enlarging a region AR3 illustrated in FIG. 8.

As illustrated in FIG. 8, in the present embodiment, the wiring lengths of the source wiring 21a and the source wiring 21b are almost the same. Moreover, the wiring interval between the source wiring 21a and the drain wiring 22 in the first direction D1 is almost the same as the wiring interval between the source wiring 21b and the drain wiring 22. Hereinafter, in FIG. 8, a region that contains the source wiring 21a and two source wirings 21b and two drain wirings 22 located between those source wirings along the first direction D1 is referred to as a "region AR3".

Next, details of a layout of the region AR3 are described with reference to FIG. 9.

Figure 9:
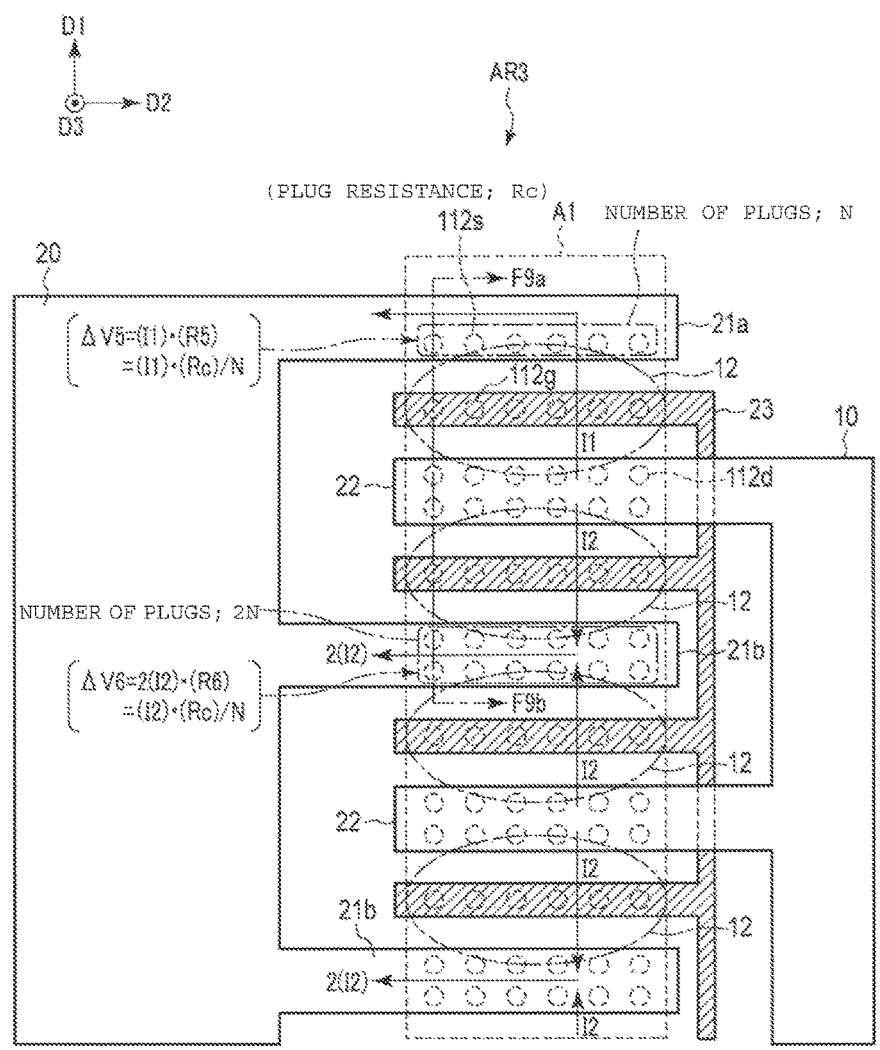
FIG. 9 is a layout chart of a region AR3 illustrated in FIG. 8.

As illustrated in FIG. 9, the number of contact plugs 112s connected to the source wiring 21a is set to N (N being a natural number of 1 or more) and the number of contact plugs 112s connected to the source wiring 21b is set to 2N. In other words, the number of contact plugs 112s connected to the source wiring 21b is set to twice the number of contact plugs 112s connected to the source wiring 21a. In the example illustrated in FIG. 9, the source wiring 21a is connected to the source of the first transistor 12 via six (N=6) contact plugs 112s arranged in one column along the second direction D2. The source wiring 21b is connected to the source the first transistor 12 via twelve (2N=12) contact plugs 112s arranged in two columns along the second direction D2.

3.2 Cross-section Structure of First Transistor

Next, a cross-section structure of the first transistor 12 is described.

Figure 10:
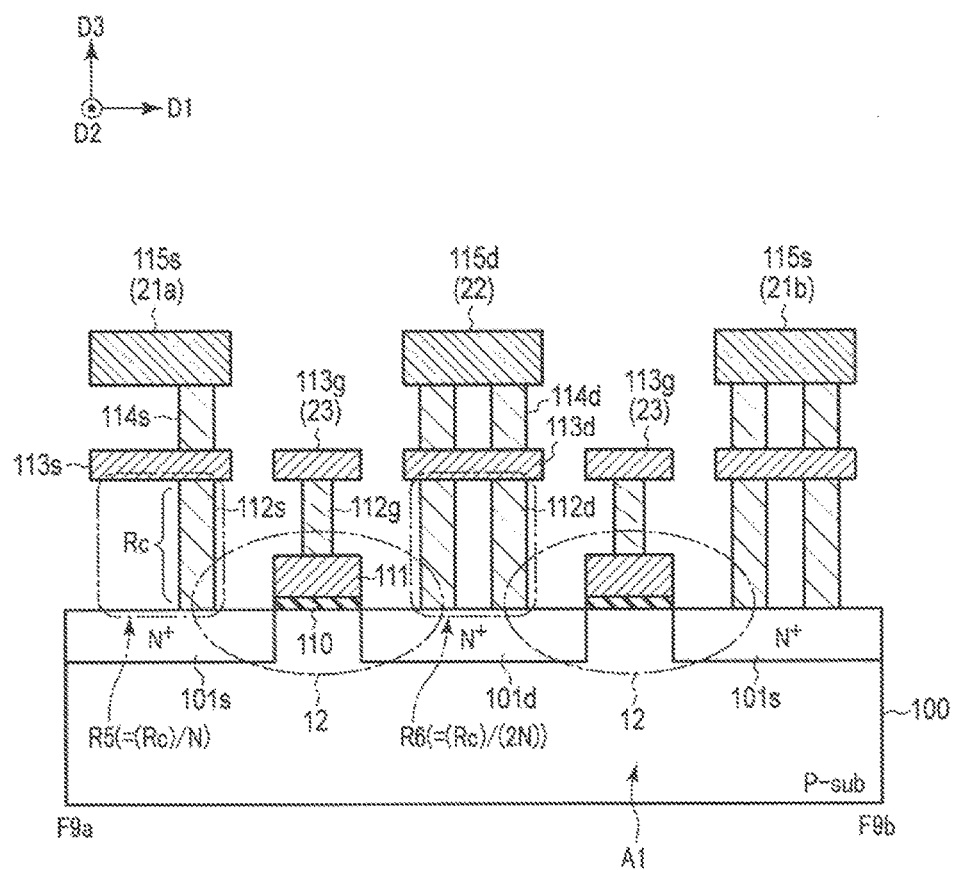
FIG. 10 is a sectional view taken along line F9a-F9b illustrated in FIG. 9.

FIG. 10 is a sectional view taken along line F9a-F9b in FIG. 9, Furthermore, in the illustration of FIG. 10, an interlayer insulating film is omitted.

As illustrated in FIG. 10, in the contact plug 112s, which connects the wiring layer 113s connected to the source wiring 21 (21a or 21b) and the N⁺ diffusion layer 101s, a resistance value obtained by adding the contact resistance between the contact plug 112s and the interface of the N⁺ diffusion layer 101s and the resistance of the contact plug 112s is referred to as a contact resistance value Rc. Then, the combined resistance value R5 of N contact plugs 112s connected to the source wiring 21a is expressed as R5=(Rc)/N. Moreover, the combined resistance value R6 of 2N contact plugs 112s connected to the source wiring 21b is expressed as R6=(Rc)/2N. Thus, the combined resistance value R5 is almost twice the combined resistance value R6.

Furthermore, as in the first embodiment, the diffusion layer distance of every first transistor 12 is approximately uniform.

3.3 Current Pathway of Discharge Current Caused by HBM Surge

Next, referring back to FIG. 9, a current pathway of discharge current caused by HBM surge is described.

As illustrated in FIG. 9, when an increase in potential in N contact plugs 112s connected to the source wiring 21a is denoted by ΔV5 and an increase in potential in 2N contact plugs 112s connected to the source wiring 21b is denoted by ΔV6, these increases in potential can be expressed as follows.

$$\Delta V5=(I1)\cdot(R5)=(I1)\cdot(Rc)/N$$

$$\Delta V6=2(I2)\cdot(R6)=(I2)\cdot(Rc)/N$$

In the present embodiment, the respective wiring resistance values of the source wiring 21a and the source wiring 21b are approximately the same, and the diffusion layer distance of the first transistor 12 connected to the source wiring 21a and the diffusion layer distance of the first transistor 12 connected to the source wiring 21b are approximately the same. In such a case, ΔV5=ΔV6 holds. Accordingly, I1≈I2 holds. Thus, in every first transistor 12, discharge current with almost the same current value flows.

3.4 Advantageous Effects of Present Embodiment

The configuration according to the present embodiment is able to obtain advantageous effects similar to those of the first and second embodiments.

Furthermore, while, in the present embodiment a case has been described in which the respective numbers of contact plugs 112s connected to the source wiring 21a and the source wiring 21b are different from each other, this is not limiting. The combined resistance value R5 of a plurality of contact plugs 112s connected to the source wiring 21a only needs to be almost twice the combined resistance value R6 of a plurality of contact plugs 112s connected to the source wiring 21b, For example, while the respective numbers of contact plugs 112s connected to the source wiring 21a and the source wiring 21b are the same, the contact resistance value Rc1 of the contact plug 112s connected to the source wiring 21a. and the contact resistance value Rc2 of the contact plug 112s connected to the source wiring 21b can be different from each other. In this case, the contact resistance values Rc1 and Rc2 are set to have a relationship of Rc1≈2(Rc2). More specifically, for example, the contact size of the contact plug 112s connected to the source wiring 21a is set smaller than the contact size of the contact plug 112s connected to the source wiring 21b.

Moreover, while the respective numbers of contact plugs 112s connected to the source wiring 21a and the source wiring 21b are set almost the same and the respective contact resistance values Rc of the contact plugs 112s connected to the source wiring 21a and the source wiring 21b are set almost the same, the contact plugs 114s can be provided in such a manner that the combined resistance value of a plurality of contact plugs 114s connected to the source wiring 21a is twice the combined resistance value of a plurality of contact plugs 114s connected to the source wiring 21b.

4. Fourth Embodiment

Next, a semiconductor device according to a fourth embodiment is described. In the case of the fourth embodiment, a layout of the ESD protection circuit in an input-output terminal is described. In the following description, only things different from those of the first to third embodiments are described.

4.1 Configuration of ESD Protection Circuit Semiconductor Device

Figure 11:
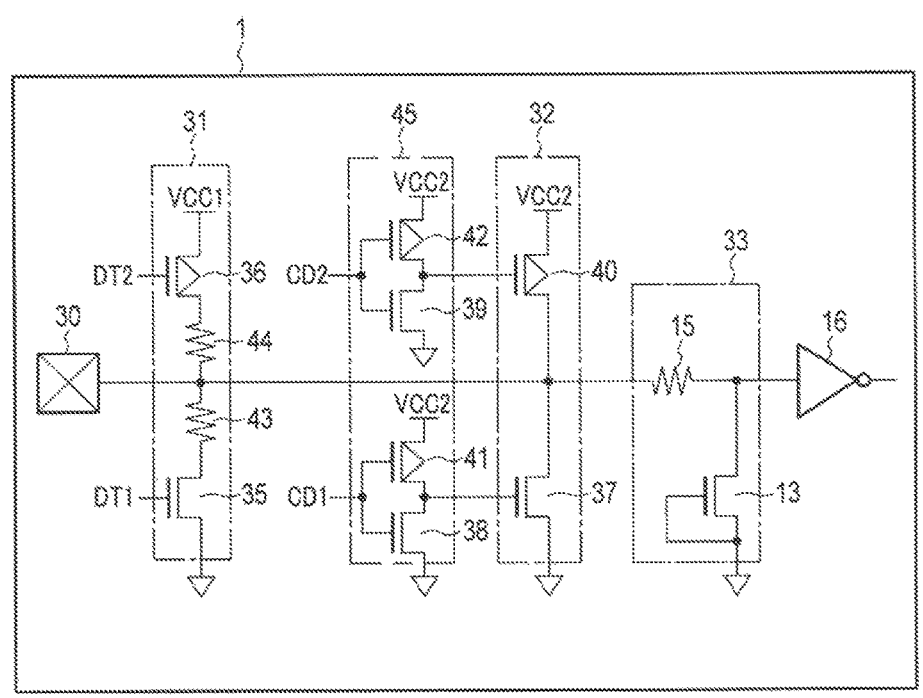
FIG. 11 is a circuit diagram of an ODT circuit, an OCD circuit, and an ESD protection circuit included in a semiconductor device according to a fourth embodiment.

First, a configuration of the ESD protection circuit in the semiconductor device is described. FIG. 11 is a circuit diagram of an ODT circuit, an OCD circuit, and an ESD protection circuit, which are included in the semiconductor device according to the present embodiment.

As illustrated in FIG. 11, the semiconductor device 1 includes an electrode pad 30, an on-die termination (ODT) circuit 31, an off-chip driver (OCD) circuit 32, a pre-driver circuit 45, an ESD protection circuit 33, and an input buffer 16. Furthermore, while FIG. 11 illustrates, by way of example, one electrode pad 30 and a circuit. configuration connected to the electrode pad 30, the other electrode pads 30 have also a similar configuration.

The electrode pad 30 is an input-output terminal which is electrically connectable to, for example, an external device. The semiconductor device 1 can input and output various signals (for example, data, an address signal, and a command) via the electrode pad 30. Furthermore, the number and location of electrode pads 30 are optional.

The ODT circuit 31 is a circuit that terminates reflection of a signal occurring between the semiconductor device 1 and the external device at the time of inputting or outputting of a signal with respect to the external device. The ODT circuit 31 is provided between the electrode pad and the input buffer 16. The ODT circuit 31 includes an NMOS transistor 35, a P-channel MOS transistor (PMOS transistor) 36, and resistor elements 43 and 44.

The NMOS transistor 35 has a gate to which a signal DT1 is input, and a source and a drain one of which is connected to one terminal of the resistor element 43 and the other of which is connected to the VSS wiring (is grounded). The NMOS transistor 35 functions as a first switch element configured to connect the VSS wiring and the resistor element 43 according to the signal DT1.

The other end of the resistor element 43 is connected to a wiring that connects the electrode pad 30 and the input buffer 16 and to one end of the resistor element 44.

The PMOS transistor 36 has a gate to which a signal DT2 is input, and a source and a drain one of which is connected to a power-supply voltage wiring of the power-supply voltage VCC1 (to one of which the power-supply voltage VCC1 is applied) and the other of which is connected to the other end of the resistor element 44. The power-supply voltage wiring of the power-supply voltage VCC1 is connected to a power-supply terminal for the power-supply voltage VCC1. The PMOS transistor 36 functions as a second switch element configured to connect a voltage wiring having the power-supply voltage VCC1 applied thereto (the power-supply voltage wiring) and the resistor element 44 according to the signal DT2.

To turn on the ODT circuit 31, the signal DT1 is set to "H" level and the signal DT2 is set to "L" level.

The OCD circuit 32 functions as a driver used to output a signal. Furthermore, the CCD circuit 32 in the present embodiment has a function as an ESD protection circuit mainly against HBM surge. The OCD circuit 32 includes an NMOS transistor 37 and a PMOS transistor 40.

One of the source and drain of the NMOS transistor 37 is connected to the wiring that connects the electrode pad 30 and the input buffer 16, and the other of the source and drain thereof is connected to the VSS wiring (is grounded). The gate of the NMOS transistor 37 is connected to the pre-driver circuit 45. The NMOS transistor 37 is turned on when an "H" level signal is applied to the gate thereof from the pre-driver circuit 45. In this case, the CCD circuit 32 applies the ground voltage VSS to the electrode pad 30.

One of the source and drain of the PMOS transistor 40 is connected to the wiring that connects the electrode pad 30 and the input buffer 16, and the other of the source and drain thereof is connected to a VCC2 wiring. The gate of the PMOS transistor 40 is connected to the pre-driver circuit 45. The PMOS transistor 40 is turned on when an "L" level signal is applied to the gate thereof from the pre-driver circuit 45. In this case, the CCD circuit 32 applies a voltage VCC2 to the electrode pad 30.

The NMOS transistor 37 and the PMOS transistor 40 of the OCD circuit 32 function as an ESD protection element. More specifically, for example, when a signal CD1 is at "H" level, the gate of the NMOS transistor 37 is connected to the VSS wiring via an NMOS transistor 38. Therefore, the NMOS transistor 37 enters the same state as that of a GGNMOS transistor. Accordingly, HBM surge is discharged via the NMOS transistor 37. Furthermore, while most of HBM surge is discharged via the NMOS transistor 37, part of HBM surge is also discharged via the PMOS transistor 40. In this case, HBM surge is discharged to the VSS wiring via the PMOS transistor 40, the VCC2 wiring, and a stabilizing capacity (not illustrated) connected to the VCC2 wiring (or a VCC2 pad).

Hereinafter, the NMOS transistor 37 of the OCD circuit 32 is also referred to as a "third transistor 37", and the PMOS transistor 40 thereof is also referred to as a "fourth transistor 40".

The pre-driver circuit 45 supplies a required voltage to the OCD circuit 32. The pre-driver circuit 45 includes NMOS transistors 38 and 39 and PMOS transistors 41 and 42.

One of the source and drain of the NMOS transistor 38 is connected to the gate of the NMOS transistor 37 and to one of the source and drain of the PMOS transistor 41. The other of the source and drain of the NMOS transistor 38 is connected to the VSS wiring, and the signal CD1 is input to the gate of the NMOS transistor 38.

The other of the source and drain of the PMOS transistor 41 is connected to a power-supply voltage wiring of the power-supply voltage VCC2" (hereinafter referred to as a "VCC2 wiring"), in other words, the power-supply voltage VCC2 is applied to the other of the source and drain of the PMOS transistor 41, and the signal CD1 is input to the gate of the PMOS transistor 41. The VCC2 wiring is connected to a power-supply terminal for the power-supply voltage VCC2 (hereinafter referred to as a "VCC2 pad") and is supplied with the power-supply voltage VCC2 from an external device. The NMOS transistor 38 and the PMOS transistor 41 function as a first pre-driver circuit for the OCD circuit 32, When the signal CD1 is at "L" level, the PMOS transistor 41 is turned on and the NMOS transistor 38 is turned off. As a result, an "H" level signal is applied to the gate of the NMOS transistor 37, so that the NMOS transistor 37 is turned on.

One of the source and drain of the NMOS transistor 39 is connected to the gate of the PMOS transistor 40 and to one of the source and drain of the PMOS transistor 42. The other of the source and drain of the NMOS transistor 39 is connected to the VSS wiring, and the signal CD2 is input to the gate of the NMOS transistor 39.

The other of the source and drain of the PMOS transistor 42 is connected to the VCC2 wiring, and the signal CD2 is input to the gate of the PMOS transistor 42. The NMOS transistor 39 and the PMOS transistor 42 function as a second pre-driver circuit for the OCD circuit 32. When the signal CD2 is at "H" level, the PMOS transistor 42 is turned off and the NMOS transistor 39 is turned on. As a result, an "L" level signal is applied to the gate of the PMOS transistor 40, so that the PMOS transistor 40 is turned on.

To output an "L" level signal to an external device from the electrode pad 30, the signal CD1 and the signal CD2 are set to "L" level, and, to output an "H" level signal, the signal CD1 and the signal CD2 are set to "H" level. Furthermore, to output no signal, the signal CD1 is set to "H" level and the signal CD2 is set to "L" level.

The ESD protection circuit 33 includes an NMOS transistor 13 and a resistor element 15. The ESD protection circuit 33 functions as an ESD protection circuit mainly against CDM surge.

4.2 Layout of Third and Fourth Transistors

Next, a layout of the third transistor 37 and the fourth transistor 40 is described with reference to FIGS. 12 to 14. In the following description, a case is described in which the respective drains of the third transistor 37 and the fourth transistor 40 are connected to the electrode pad 30, the source of the third transistor 37 is connected to a VSS wiring 50, and the source of the fourth transistor 40 is connected to a VCC2 wiring 51. Furthermore, the source and drain of the third transistor 37 or the fourth transistor 40 can be replaced with each other.

Figure 12:
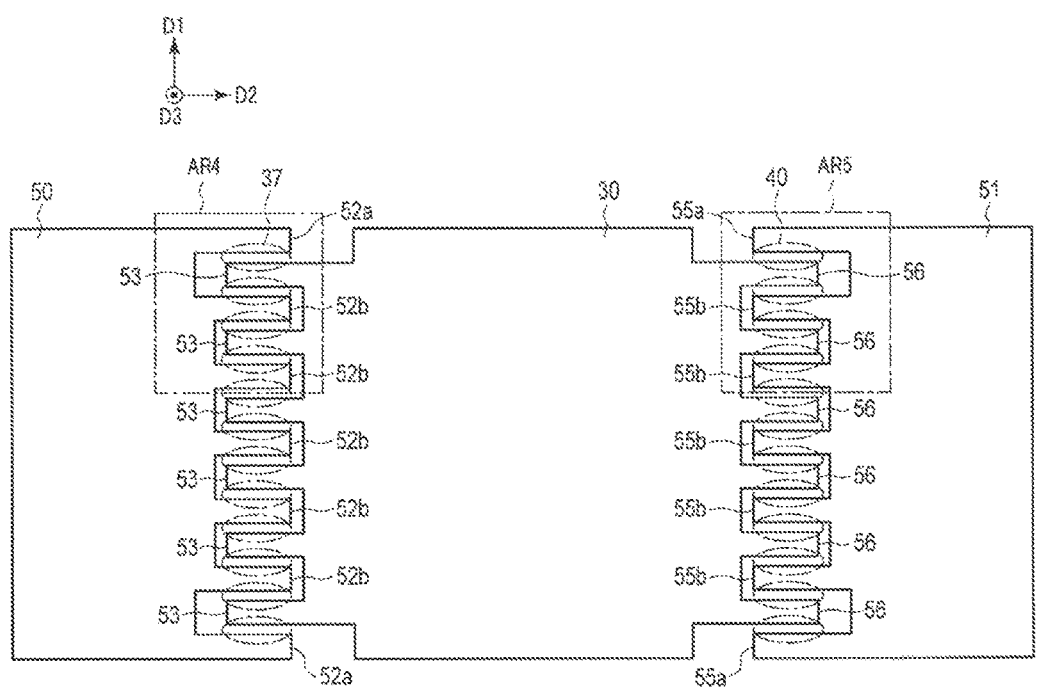
FIG. 12 is a layout chart of an electrode pad, a VSS wiring, and a VCC2 wiring included in the semiconductor device according to the fourth embodiment.
Figure 13:
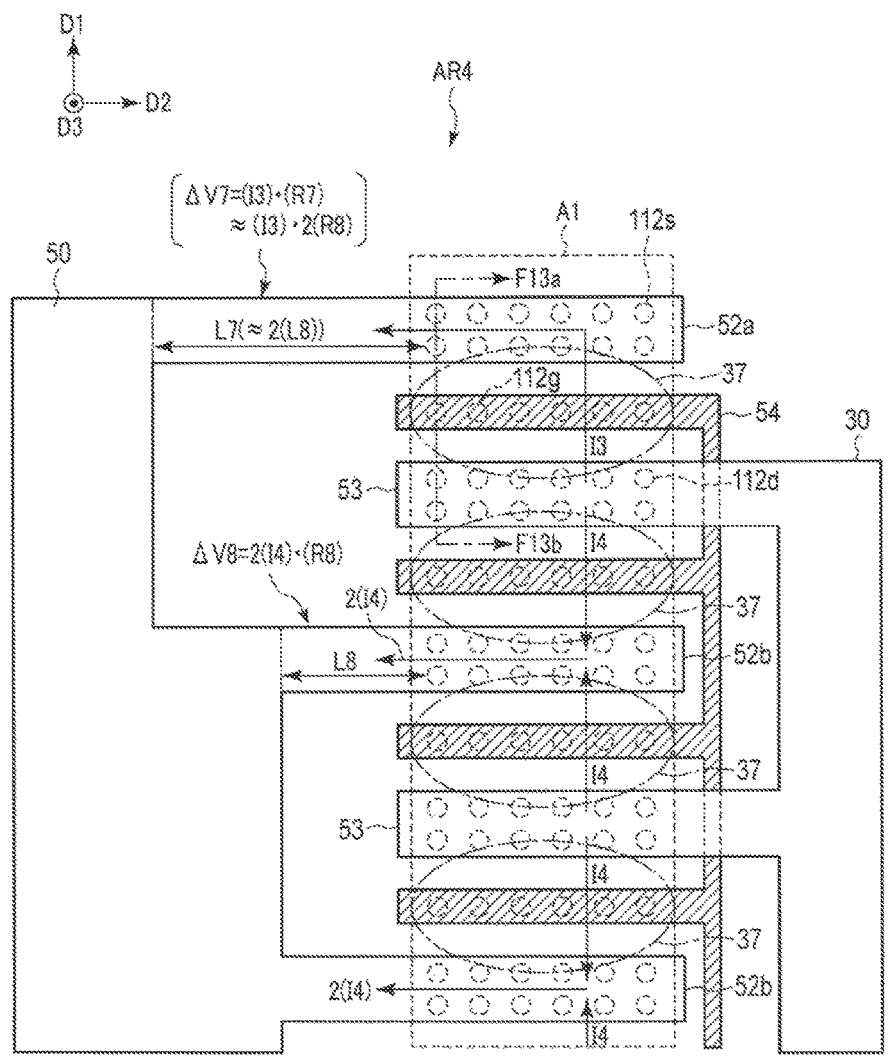
FIG. 13 is a layout chart of a region AR4 illustrated in FIG. 12.
Figure 14:
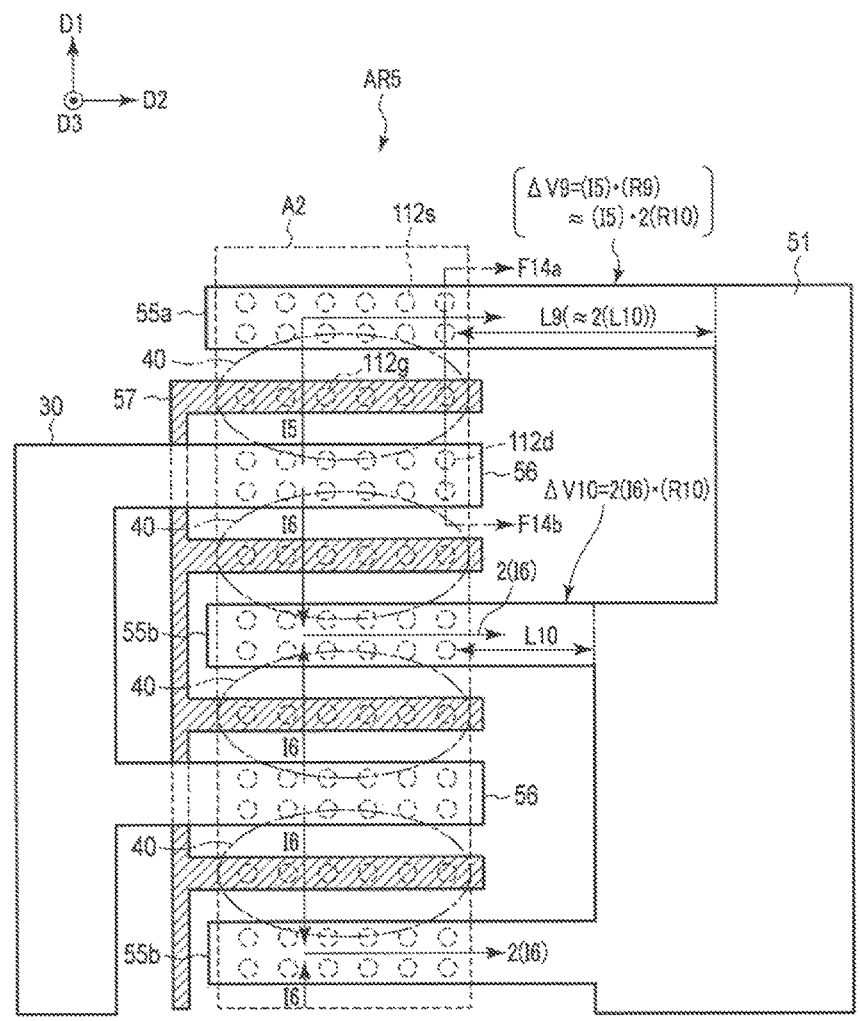
FIG. 14 is a layout chart of a region AR5 illustrated in FIG. 12.

FIG. 12 is a layout chart of the electrode pad 30, the VSS wiring 50, and the VCC2 wiring 51, which are included in the semiconductor device according to the present embodiment FIGS. 13 and 14 are layout charts obtained by enlarging a region AR4 and a region AR5, respectively, illustrated in FIG. 12, As illustrated in FIG. 12, the electrode pad 30 and the VSS wiring 50 are located in such a mariner that respective sides thereof extending along the first direction D1 are adjacent to each other. Similarly, the VCC2 wiring 51 is located in such a manner that one side thereof is adjacent to the other side of the electrode pad 30 along the first direction D1. In other words, the electrode pad 30 is located between the VSS wiring 50 and the VCC2 wiring 51 along the second direction D2.

The electrode pad 30 in the present embodiment has six first drain wirings 53 connected to one side thereof adjacent to the VSS wiring 50 and has six second drain wirings 56 connected to one side thereof adjacent to the VCC2 wiring 51.

The first drain wiring 53 connects the electrode pad 30 and the drain of the third transistor 37. The six first drain wirings 53 are arranged side by side along the first direction D1, and each first drain wiring 53 extends in the second direction D2. The six first drain wirings 53 are arranged approximately at regular intervals along the first direction D1. The six first drain wirings 53 are almost the same in wiring length.

The second drain wiring 56 connects the electrode pad 30 and the drain of the fourth transistor 40. The six second drain wirings 56 are arranged side by side along the first direction D1, and each second drain wiring 56 extends in the second direction D2. The six second drain wirings 56 are arranged approximately at regular intervals along the first direction D1. The six second drain wirings 56 are almost the same in wiring length.

The VSS wiring 50 has seven first source wirings 52 (52a and 52b) connected to one side thereof adjacent to the electrode pad 30, as in the first embodiment. The first source wirings 52 (52a and 52b) connect the VSS wiring 50 and the sources of the third transistors 37. The seven first source wirings 52 (52a and 52b) are arranged side by side in the first direction D1, and each of the first source wirings 52 (52a and 52b) extends in the second direction D2. The first drain wirings 53 and the first source wirings 52 (52a and 52b) are alternately arranged one by one along the first direction D1. In the following description, in the case of differentiating between first source wirings located at both ends in the first direction D1 and the other first source wirings, the first source wirings located at both ends are referred to as the "first source wirings 52a" and the other first source wirings are referred to as the "first source wirings 52b". In the present embodiment as in the first embodiment, the seven first source wirings 52 (52a and 52b) are arranged approximately at regular intervals along the first direction D1, and are also arranged in such a manner that the respective wiring intervals with the first drain wirings 53 are approximately regular intervals. Moreover, the wiring length of the first source wiring 52a is greater than that of the first source wiring 52b.

The VCC2 wiring 51 has seven second source wirings 55 (55a and 55b) connected to one side thereof adjacent to the electrode pad 30. The second source wirings 55 (55a and 55b) connect the VCC2 wiring 51 and the sources of the fourth transistors 40. The seven second source wirings 55 (55a and 55b) are arranged side by side in the first direction D1, and each of the second source wirings 55 (55a and 55b) extends in the second direction D2. The second drain wirings 56 and the second source wirings 55 (55a and 55b) are alternately arranged one by one along the first direction D1. In the following description, in the case of differentiating between second source wirings located at both ends in the first direction D1 and the other second source wirings, the second source wirings located at both ends are referred to as the "second source wirings 55a." and the other second source wirings are referred to as the "second source wirings 55b". In the present embodiment, the seven second source wirings 55 (55a and 55b) are arranged approximately at regular intervals along the first direction D1, and are also arranged in such a manner that the respective wiring intervals with the second drain wirings 56 are approximately regular intervals. Moreover, the wiring length of the second source wiring 55a is greater than that of the second source wiring 55b.

Furthermore, the respective numbers of first source wirings 52 (52a and 52b), second source wirings 55 (55a and 55b), first drain wirings 53, and second drain wirings 56 are optional. For example, the number of first drain wirings 53 and the number of second drain wirings 56 can be different from each other. However, the number of first source wirings 52 (52a and 52b) is greater by one than the number of first drain wirings 53, and the number of second source wirings 55 (55a and 55b) is greater by one than the number of second drain wirings 56.

in the example illustrated in FIG. 12, twelve third transistors 37 are respectively provided in regions in which the first source wirings 52 (52a and 52b) and the first drain wirings 53 are alternately arranged one by one along the first direction D1 Moreover, twelve fourth transistors 40 are respectively provided in regions in which the second source wirings 55 (55a and 55b) and the second drain wirings 56 are alternately arranged one by one.

Hereinafter, a region that contains the first source wiring 52a and two first source wirings 52b and two first drain wirings 53 located between those first source wirings along the first direction D1 is referred to as a "region AR4". Moreover, a region that contains the second source wiring 55a and two second source wirings 55b and two second drain wirings 56 located between. those second source wirings is referred to as a "region AR5".

Next, details of a layout of the region AR4 are described with reference to FIG. 13.

As illustrated in FIG. 13, the locations of the first source wirings 52 (52a and 52b), the first drain wirings 53, the first gate wiring 54, and the third transistors 37 in the present embodiment are similar to those illustrated in FIG. 3 in the first embodiment, In other words, the source wirings 21 (21a and 21b) can be replaced with the first source wirings 52 (52a and 52b), the drain wirings 22 can be replaced with the first drain wirings 53, the gate wiring 23 can be replaced with the first gate wiring 54, and the first transistors 12 can be replaced with the third transistors 37. The first gate wiring 54 connects the gate of the third transistor 37 and the drains of the NMOS transistor 38 and the PMOS transistor 41.

As in the first embodiment, the first source wiring 52a in the present embodiment is longer than the first source wiring 52b. More specifically, in the first source wiring 52a, the wiring length from a connecting location between the first source wiring 52a and the VSS wiring 50 (the end portion of the first source wiring 52a) to a connecting location between the first source wiring 52a and the source of the third transistor 37 (the contact plug 112s) is denoted by L7, Similarly, the wiring length in the first source wiring 52b is denoted by L8. Then, the wiring lengths L7 and L8 are laid out in such a manner as to have a relationship of L7≈2 (L8). In other words, the wiring length L7 of the first source wiring 52a is approximately twice the wiring length L8 of the first source wiring 52b.

Next , details of a layout of the region AR5 are described with reference to FIG. 14.

As illustrated in FIG. 14, the second source wirings 55 (55a and 55b), the second drain wirings 56, the second gate wiring 57, and the fourth transistors 40 in the present embodiment are bilaterally symmetrical to the first source wirings 52 (52a and 52b), the first drain wirings 53, the first gate wiring 54, and the third transistors 37 in the second direction D2 in FIG. 13. The second gate wiring 57 connects the gate of the fourth transistor 40 and the drains of the LIMOS transistor 39 and the PMOS transistor 42. In a region in which a plurality of second source wirings 55 (55a and 55b) and a plurality of second drain wirings 56 are arranged along the first direction D1, a plurality of fourth transistors 40 is provided on the semiconductor substrate along the first direction D1 Hereinafter, a region which is surrounded by an element isolation area in the vicinity of the surface of the semiconductor substrate and in which a plurality of fourth transistors is provided is referred to as an "activation region A2".

Similar to the case of the first source wirings 52 (52a and 52b), the second source wiring 55a is longer than the second source wiring 55b. More specifically, in the second source wiring 55a, the wiring length from a connecting location between the second source wiring 55a and the VCC2 wiring 51 (the end portion of the second source wiring 55a) to a connecting location between the second source wiring 55a and the source of the fourth transistor 40 (the contact plug 112s) is denoted by L9. Similarly, the wiring length in the second source wiring 55b is denoted by L10. Then, the wiring lengths L9 and L10 are laid out in such a way as to have a relationship of L9≈2(L10). In other words, the wiring length L9 of the second source wiring 55a is approximately twice the wiring length L10 of the second source wiring 55b.

4.3 Cross-section Structures of Third Transistor and Fourth Transistor

Next, cross-section structures of the third transistor 37 and the fourth transistor 40 are described.

Figure 15:
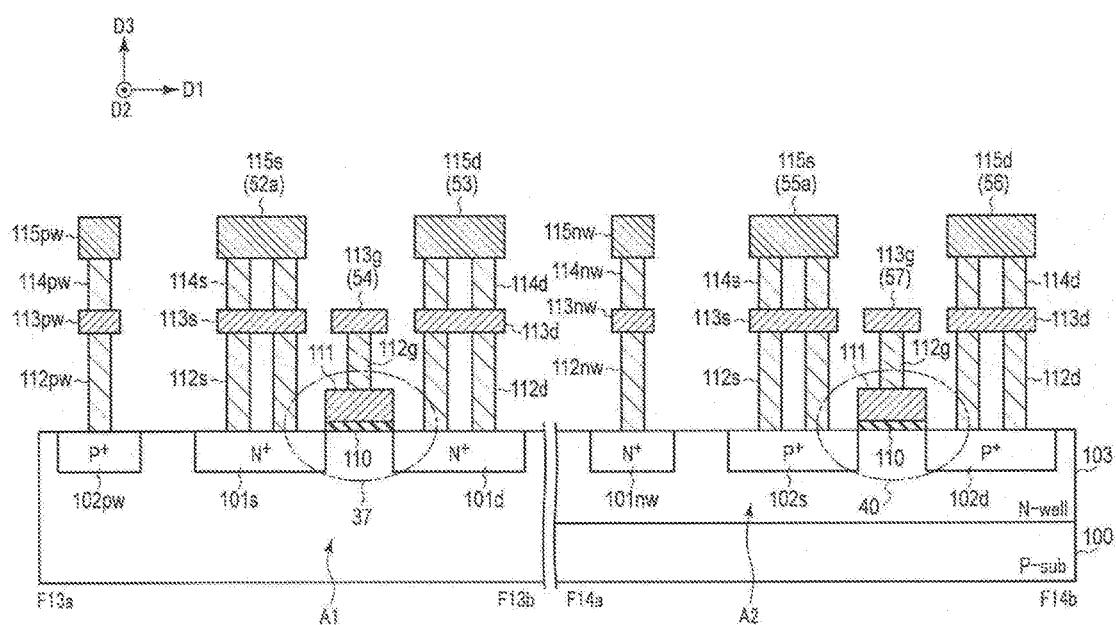
FIG. 15 is a sectional view taken along line F13a-F13b illustrated in FIG. 13 and line F14a-F14b illustrated in FIG. 14.

FIG. 15 is a sectional view taken along line F13a-F13b illustrated in FIG. 13 and line F14a-F14b illustrated in FIG. 14. Furthermore, in the illustration of FIG. 15, an interlayer insulating film is omitted. Moreover, while, in FIG. 15, for ease of explanation, a cross-section surface taken along line F13a-F13b and a cross-section surface taken along line F14a-F14b are illustrated side by side along the first direction D1, the third transistor 37 and the fourth transistor 40 do not need to be arranged side by side along the first direction D1 in the actual layout.

As illustrated in FIG. 15, the cross-section structure of the third transistor 37 in the activation. region Al is similar to that illustrated in FIG. 4 in the first embodiment. The wiring layer 113g connected to the gate electrode 111 via the contact plug 112g functions as, for example, the first gate wiring 54. The wiring layer 115s connected to the N$^+$ diffusion layer 101s via the contact plug 112s, the wiring layer 113s, and the contact plug 114s functions as, for example, the first source wiring 52a. Similarly, the wiring layer 115d connected to the N diffusion layer 101d via the contact plug 112d, the wiring layer 113d, and the contact plug 114d functions as, for example, the first drain wiring 53.

In the activation region A1, a P$^+$ diffusion layer region 102pw is provided at the surface region of the semiconductor substrate 100, and is connected to a wiring layer 115pw via contact plugs 112pw, a wiring layer 113pw, and contact plugs 114pw. The wiring layer 115pw connected to the P$^+$ diffusion layer region 102pw functions as a well wiring used to apply an electrical potential to the semiconductor substrate 100 (the activation region A1).

Furthermore, in the activation region A2, an N-type well 103 is provided. A plurality of P$^+$ diffusion layers 102s, which functions as the sources of the fourth transistors 40, and a plurality of P$^+$diffusion layers 102d, which functions as the drains of the fourth transistors 40, are provided at the surface region of the N-type well 103. A plurality of gate insulating films 110 extending in the second direction D2 is provided along the first direction D1 on the N-type well 103, and gate electrodes 111 are provided on the upper surfaces of the gate insulating films 110. The gate insulating film 110 and the gate electrode 111 function as the gate of the fourth transistor 40. The wiring layer 113g connected to the gate electrode 111 via the contact plug 112g functions as, for example, the second gate wiring 57. The wiring layer 115s connected to the P+ diffusion layer 102s via the contact plug 112s, the wiring layer 113s, and the contact plug 114s functions as, for example, the second source wiring 55 (55a or 55b). Similarly, the wiring layer 115d connected to the P+ diffusion layer 102d via the contact plug 112d, the wiring layer 113d, and the contact plug 114d functions as, for example, the second drain wiring 56.

An N+ diffusion layer region 101nw is provided at the surface region of the N-type well 103, and is connected to a wiring layer 115nw via contact plugs 112nw, a wiring layer 113nw, and contact plugs 114nw. The wiring layer 115nw connected to the N+ diffusion layer region 101nw functions as a well wiring used to apply an electrical potential to the N-type well 103.

In the present embodiment, as in the first embodiment, the respective numbers of contact plugs 112s and contact plugs 114s connected to the first source wiring 52a are the same as the respective numbers of contact plugs 112s and contact plugs 114s connected to the first source wiring 52b. Moreover, the respective contact sizes of the contact plugs 112s and the contact plugs 114s connected to the first source wiring 52a are almost the same as the respective contact sizes of the contact plugs 112s and the contact plugs 114s connected to the first source wiring 52b. In other words, the respective combined resistance values of a plurality of contact plugs 112s and contact plugs 114s connected to the first source wiring 52a are almost the same as the respective combined resistance values of a plurality of contact plugs 112s and contact plugs 114s connected to the first source wiring 52b. The same also applies to the contact plugs 112s and the contact plugs 114s connected to the second source wirings 55a and 55b.

Moreover, the on-resistance of the third transistor 37 connected to the first source wiring 52a is almost the same as the on-resistance of the third transistor 37 connected to the first source wiring 52b. This also applies to the respective on-resistances of the fourth transistors 40 connected to the second source wirings 55a and 55b.

Moreover, the wiring width and wiring height of the wiring layer 115s functioning as the first source wiring 52a are almost the same as the wiring width and wiring height of the wiring layer 115s functioning as the first source wiring 52b. Similarly, the wiring width and wiring height of the wiring layer 115s functioning as the second source wiring 55a are almost the same as the wiring width and wiring height of the wiring layer 115s functioning as the second source wiring 55b.

Furthermore, the respective numbers of third transistors 37 and fourth transistors 40 can be different from each other. Moreover, the respective on-resistances of the third transistor 37 and the fourth transistor 40 can be different from each other. Additionally, the source resistance value between the source of the third transistor 37 and the first source wiring 52 (52a or 52b) can be different from the source resistance value between the source of the fourth transistor 40 and the second source wiring 55 (55a or 55b). Moreover, the wiring width and wiring height of the first source wiring 52 (52a or 52b) and the wiring width and wiring height of the second source wiring 55 (55a or 55b) can be different from each other.

Furthermore, the first source wiring 52 (52a or 52b), the first drain wiring 53, the first gate wiring 54, the second source wiring 55 (55a or 55b), the second drain wiring 56, and the second gate wiring 57 can be formed in the respective different wiring layers.

4.4 Current Pathway of Discharge Current Caused by HBM Surge

Next, referring back to FIGS. 13 and 14, a current pathway of discharge current caused by HBM surge is described.

First, a case where discharge current flows through the third transistor 37, which serves as a main current pathway of discharge current, is described.

As illustrated in FIG. 13, a discharge current which flows from the first drain wiring 53 to the first source wiring 52a via the third transistor 37 is denoted by I3, and a discharge current which flows through the first source wiring 52b is denoted by I4. Then, similar to FIG. 3 in the first embodiment, since one third transistor 37 is connected to the first source wiring 52a, the current I3 flows through the first source wiring 52a, In contrast to this, since two third transistors 37 are connected to the first source wiring 52b, a current which is approximately twice the current I4 flows through the first source wiring 52b.

In the first source wirings 52a and 52b, the respective wiring resistance values in the wiring lengths L7 and L8 are denoted by R7 and R8, respectively. Then, since a relationship of L7≈2(L3) holds, the wiring resistance values R7 and R8 have a relationship of R7≈2(R8).

Furthermore, in the first source wirings 52a and 52b, increases in potential caused by the flow of discharge current, which are denoted by ΔV7 and ΔV8, can be expressed as follows.

$$\Delta V7 = (I3) \cdot (R7) \approx (I3) \cdot 2(R8)$$

$$\Delta V8 = 2(I4) \cdot (R8)$$

Here, since ΔV7=ΔVB holds, I3≈I4 holds. In other words, discharge current with almost the same current value flows through each third transistor 37. At this time, a current which is approximately twice the current flowing through the first source wiring 52a flows through the first source wiring 52b.

Next, a case where discharge current flows through the fourth transistor 40 is described.

As illustrated in FIG. 14, a discharge current which flows from the second drain wiring 56 to the second source wiring 55a via the fourth transistor 40 is denoted by I5, and a discharge current which flows through the second source wiring 55b is denoted by I6. Then, similar to the case of the third transistor 37, since one fourth transistor 40 is connected to the second source wiring 55a, the current I5 flows through the second source wiring 55a. In contrast to this, since two fourth transistors 40 are connected to the second source wiring 55b, a current which is approximately twice the current I6 flows through the second source wiring 55b.

In the second source wirings 55a and 55b, the respective wiring resistance values in the wiring lengths L9 and L10 are denoted by R9 and R10, respectively. Then, since a relationship of L9≈2(L10) holds, the wiring resistance values R9 and R10 have a relationship of R9≈2(R10).

Furthermore, in the second source wirings 55a and 55b, increases in potential caused by the flow of discharge current, which are denoted by ΔV9 and ΔV10 , can be expressed as follows.

$$\Delta V9=(I5)\cdot(R9)\approx(I5)\cdot 2(R10)$$

$$\Delta V10=2(I6)\cdot(R10)$$

Here, since ΔV9=ΔV10 holds, I5≈I6 holds. In other words, discharge current with almost the same current value flows through each fourth transistor 40. At this time, a current which is approximately twice the current flowing through the second source wiring 55*a* flows through the second source wiring 55*b*.

4.5 Advantageous Effects of Present Embodiment

The configuration according to the present embodiment is able to obtain advantageous effects similar to those of the first embodiment.

Furthermore, while, in the present embodiment, a case has been described in which the wiring length of the first source wiring 52*a* is different from the wiring length of the first source wiring 52*b* and the wiring length of the second source wiring 55*a* is different from the wiring length of the second source wiring 55*b*, this is not limiting. For example, the fourth embodiment can be combined with the second or third embodiment. More specifically, the wiring length of the first source wiring 52*a* and the wiring length of the first source wiring 52*b* are set to the same, and the wiring length of the second source wiring 55*a* and the wiring length of the second source wiring 55*b* are set to the same. Then, the diffusion layer length of the third transistor 37 connected to the first source wiring 52*a*. is set to approximately twice the diffusion layer length of the third transistor 37 connected to the first source wiring 52*b*. Similarly, the diffusion layer length of the fourth transistor 40 connected to the second source wiring 55*a* is set to approximately twice the diffusion layer length of the fourth transistor 40 connected to the second source wiring 55*b*. Moreover, for example, the number of first contact plugs 112*s* connected to the first source wiring 52*a* is set to N, and the number of first. contact plugs 112*s* connected to the first source wiring 52*b* is set to 2N. Similarly, the number of first contact plugs 112*s* connected to the second source wiring 55*a* is set to N, and the number of first contact plugs 112*s* connected to the second source wiring 55*b* is set to 2N.

5. Modification Examples

The semiconductor device according to the above-described embodiments includes first and second wirings (22 in FIG. 3) connected to a terminal (10 in FIG. 3) connectable to an external apparatus, third and fourth wirings (21*a* and 21*b* in FIG. 3) connected to a ground voltage wiring (20 in FIG. 3) , a first NMOS transistor (12 in FIG. 3) having a source and a drain one of which is connected to the first wiring and the other of which is connected to the third wiring and having a gate connected to the ground voltage wiring, a second NMOS transistor (12 in FIG. 3) having a source and a drain one of which is connected to the first wiring and the other of which is connected to the fourth wiring and having a gate connected to the ground voltage wiring, and a third NMOS transistor (12 in FIG. 3) having a source and a drain one of which is connected to the second wiring and the other of which is connected to the fourth wiring and having a gate connected to the ground voltage wiring. When discharge current caused by ESD flows from the terminal to the ground voltage wiring, the resistance value of a first current pathway leading from the first wiring to the ground voltage wiring via the first NMOS transistor and the third wiring is higher than the resistance value of a second current pathway leading from the first wiring to the ground voltage wiring via the second NMOS transistor and the fourth wiring.

Applying the above-described embodiments enables providing a semiconductor device capable of improving an ESD breakdown voltage. Furthermore, embodiments are not limited to the above-described aspects, but can be modified in various manners.

For example, some or all of the above-described first to fourth embodiments can be combined wherever possible. For example, the first embodiment and the fourth embodiment can be applied to an input terminal and an input-output terminal of the semiconductor device, respectively.

Furthermore, the term "connection" in the above-described embodiments also includes a state of being indirectly connected with some other thing, such as a transistor or a resistor, intervening between two elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electrostatic discharge semiconductor device comprising:
    one or more wiring layers disposed over a substrate, comprising:
        a first wiring electrically connected at a first connecting point of a pad,
        a second wiring electrically connected at a second connecting point of a ground wiring, and
        a third wiring electrically connected at a third 859033 connecting point of the ground wiring;
    a first transistor formed in the substrate comprising a first diffusion region electrically connected to the first wiring, a second diffusion region electrically connected to the second wiring, and a gate electrically connected to the ground wiring; and
    a second transistor formed in the substrate comprising the first diffusion region electrically connected to the first wiring, a third diffusion region electrically connected to the third wiring, and a gate electrically connected to the ground wiring,
    wherein,
        a first resistance value of a first current pathway leading from the first connecting point to the second connecting point via the first transistor is different from a second resistance value of a second current pathway leading from the first connecting point to the third connecting point via the second transistor.

2. The electrostatic discharge semiconductor device according to claim 1, wherein the first resistance value is higher than the second resistance value.

3. The electrostatic discharge semiconductor device according to claim 2, wherein,
    the second wiring is defined by a first end corresponding to the second connecting point and a second end corresponding to a fifth connecting point to an underlying layer, the third wiring layer is defined by a first end corresponding to the third connecting point and a second end corresponding to a sixth connecting point to an underlying layer, and
a third resistance of a third current pathway from the second connecting point to the fifth connecting point is higher than a fourth resistance value of a fourth current pathway from the third connecting point to the sixth connecting point.

4. The electrostatic discharge semiconductor device according to claim 3, wherein,
a fifth resistance value of a fifth current pathway from the fifth connecting point to the second diffusion region is substantially the same as a sixth resistance value of a sixth current pathway from the sixth connecting point to the third diffusion region.

5. The electrostatic discharge semiconductor device according to claim 1, wherein the second wiring is approximately twice the length as the third wiring.

6. The electrostatic discharge semiconductor device according to claim 1, further comprising:
a fourth wiring of the one or more wiring layers and electrically connected at a fourth connecting point of the pad; and
a third transistor formed in the substrate comprising a fourth diffusion regional electrically connected to the fourth wiring, the diffusion region electrically connected to the third wiring, and a gate connected to the ground wiring.

7. The electrostatic discharge semiconductor device according to claim 1, further comprising:
a pad wiring electrically connected to the pad, the pad wiring including a first elongated portion, the first elongated portion being the first wiring.

8. The electrostatic discharge semiconductor device according to claim 7, further comprising:
an elongated ground wiring electrically connected to the ground wiring, the elongated ground wiring including a second elongated portion and a third elongated portion, the second elongated portion being the second wiring, the third elongated portion being the third wiring.

9. The electrostatic discharge semiconductor device according to claim 8, wherein when a first length of the second elongated portion is defined as a distance between a first end corresponding to the second connecting point and a first contact portion connected to an underlying layer, and a second length of the third elongated portion is defined as a distance between a first end corresponding to the third connecting point and a second contact portion connected to an underlying layer,
the first length is different from the second length.

10. The electrostatic discharge semiconductor device according to claim 9, wherein the first length is approximately twice the second length.

11. The electrostatic discharge semiconductor device according to claim 1, further comprising:
a first plug electrically connecting the second wiring and the second diffusion region; and
a second plug electrically connecting the third wiring and the third diffusion region,
wherein,
a first distance is defined by a distance from the gate of the first transistor to the first plug,
a second distance is defined by a distance from the gate of the second transistor to the second plug, and
the first distance is approximately twice the second distance.

12. The electrostatic discharge semiconductor device according to claim 1, further comprising:
a plurality of first plugs electrically connecting the first wiring and the first diffusion region;
a plurality of second plugs electrically connecting the second wiring and second diffusion region; and
plurality of third plugs electrically connecting the third wiring and third diffusion region.

13. The electrostatic discharge semiconductor device according to claim 12, wherein a number of the plurality of first plugs is approximately twice a number of the plurality of second plugs.

14. The electrostatic discharge semiconductor device according to claim 12, wherein a number of the plurality of third plugs is approximately twice a number of the plurality of second plugs.

15. The electrostatic discharge semiconductor device according to claim 12, wherein a number of the plurality of first plugs is approximately the same as a number of the plurality of third plugs.

16. The electrostatic discharge semiconductor device according to claim 12,
the second wiring is defined by a first end corresponding to the second connecting point and a second end corresponding to a fifth connecting point to the plurality of second plugs,
the third wiring layer is defined by a first end corresponding to the third connecting point and a second end corresponding to a sixth connecting point to the plurality of third plugs, and
a third resistance of a third current pathway from the second connecting point to the fifth connecting point is approximately the same as a fourth resistance value of a fourth current pathway from the third connecting point to the sixth connecting point.

17. The electrostatic discharge semiconductor device according to claim 1, wherein the first wiring is arranged between the second wiring and the third wiring in a first direction.

18. The electrostatic discharge semiconductor device according to claim 6, wherein the first wiring, the second wiring, the third wiring, and the fourth wiring are arranged alternately in a first direction.

19. The electrostatic discharge semiconductor device according to claim 1, wherein,
the pad and the ground wiring are disposed in a first wiring layer of the one or more wiring layers, and
the first wiring, the second wiring, and the third wiring are formed in a second layer of the one or more wiring layers.

20. The electrostatic discharge semiconductor device according to claim 19, wherein the first layer and the second layer are disposed in a same layer of the one or more wiring layers.

* * * * *